(12) United States Patent
Shimizu et al.

(10) Patent No.: US 6,676,885 B2
(45) Date of Patent: Jan. 13, 2004

(54) PLURAL SEMICONDUCTOR DEVICES BONDED ONTO ONE FACE OF A SINGLE CIRCUIT BOARD FOR SUBSEQUENT BATCH RESIN ENCAPSULATION OF THE PLURAL SEMICONDUCTOR DEVICES IN A SINGLE CAVITY FORMED BY MOLDING DIES

(75) Inventors: Kazuo Shimizu, Yamagata (JP); Hisayuki Tsuruta, Tokyo (JP)

(73) Assignee: NEC Electronics Corporation (JP)

( * ) Notice: Subject to any disclaimer, the term of this patent is extended or adjusted under 35 U.S.C. 154(b) by 260 days.

(21) Appl. No.: 09/781,789

(22) Filed: Feb. 12, 2001

(65) Prior Publication Data

US 2001/0013674 A1 Aug. 16, 2001

(30) Foreign Application Priority Data

Feb. 10, 2000 (JP) ........................................ 2000-033380

(51) Int. Cl.⁷ ........................... B29C 45/14; B29C 70/70
(52) U.S. Cl. ............. 264/511; 264/272.14; 264/272.15; 264/272.17; 264/276
(58) Field of Search ............................... 264/511, 513, 264/272, 14, 272.15, 272.17, 276, 328.4, 328.5, 157; 425/89, 116, 544, 546

(56) References Cited

U.S. PATENT DOCUMENTS

| | | | | | |
|---|---|---|---|---|---|
| 4,944,908 | A | * | 7/1990 | Leveque et al. ............. | 264/232 |
| 5,147,821 | A | * | 9/1992 | McShane et al. ....... | 264/272.17 |
| 5,603,879 | A | * | 2/1997 | Osada et al. .................. | 264/102 |
| 5,846,477 | A | * | 12/1998 | Hotta et al. ................... | 264/511 |
| 5,891,384 | A | * | 4/1999 | Miyajima ..................... | 264/511 |
| 6,048,483 | A | * | 4/2000 | Miyajima ................ | 264/272.14 |
| 6,126,885 | A | * | 10/2000 | Oida et al. ................... | 264/511 |
| 6,258,314 | B1 | * | 7/2001 | Oida et al. ................... | 264/511 |
| 6,344,162 | B1 | * | 2/2002 | Miyajima .............. | 264/272.14 |
| 6,350,113 | B1 | * | 2/2002 | Miyajima ..................... | 425/89 |
| 6,439,869 | B1 | * | 8/2002 | Seng et al. .................... | 425/89 |
| 6,444,157 | B1 | * | 9/2002 | Miyajima .................... | 264/511 |

FOREIGN PATENT DOCUMENTS

| | | |
|---|---|---|
| JP | 61-8932 | 1/1986 |
| JP | 2-297945 | 12/1990 |
| JP | 6-232193 | 8/1994 |
| JP | 8-142106 | 6/1996 |
| JP | 9-117931 | 5/1997 |
| JP | 11-40593 | 2/1999 |
| KR | 1998-058464 | 7/1998 |

* cited by examiner

Primary Examiner—Angela Ortiz
(74) Attorney, Agent, or Firm—Hayes Soloway P.C.

(57) ABSTRACT

The present invention provides a resin-molding method comprising the steps of: placing a circuit base member onto a mounting face of first one of paired dies, wherein a back face of the circuit base member is in contact with the mounting face; placing the paired dies in a closing state for clamping a peripheral region of the circuit base member with the paired dies; and injecting a molten resin into a cavity of the paired dies for filling the cavity with the injected resin, wherein, in the closing state, a first pressure effected to a front face of the circuit base member is set higher in pressure level than a second pressure effected to the back face of the circuit base member, so as to secure the circuit base member to the mounting face.

17 Claims, 23 Drawing Sheets

GATE

GATE

GATE

PLURAL SEMICONDUCTOR DEVICES BONDED ONTO ONE FACE OF A SINGLE CIRCUIT BOARD FOR SUBSEQUENT BATCH RESIN ENCAPSULATION OF THE PLURAL SEMICONDUCTOR DEVICES IN A SINGLE CAVITY FORMED BY MOLDING DIES

BACKGROUND OF THE INVENTION

The present invention relates to a resin-molding method, molding dies and a circuit base member and more particularly to a transfer molding technique, wherein plural semiconductor devices are bonded onto one face of a single circuit board for subsequent batch resin encapsulation of the plural semiconductor devices in a single cavity formed by molding dies.

The transfer mold has most-widely been used for the resin-encapsulation technique of semiconductor devices, wherein the plural semiconductor devices are bonded on a circuit base member, which includes a circuit board, a circuit film and a circuit tape for subsequently placing the semiconductor devices in a cavity of the dies, so that a molten resin is injected into a cavity by a plunger of a molding machine to carry out a resin-encapsulation of the semiconductor devices.

Plural semiconductor devices are aligned in matrix over a single Circuit base member for subsequent resin-encapsulation thereof. It is possible in one method to encapsulate the single package semiconductor devices with resin sequentially. It is also possible in another method to encapsulate the plural packages semiconductor devices with resin at one time. The later method, for example, the batch resin encapsulation is superior in high productivity and lower cost.

The single semiconductor package resin-encapsulation method is a method in which the semiconductor devices for one package are resin-encapsulated in one cavity different from other cavity in which other semiconductor devices for other package are independently resin-encapsulated. Side faces of the encapsulating resin are defined by the inner shapes of the molding dies. Independent plural encapsulating resins for individual packages are formed by the resin-molding process in the molding dies. It is unnecessary to carry out a dicing process for cutting or dividing the encapsulating resin. If any interconnection layer or any solder-resist layer is present on the circuit base member or on its cutting line such as a scribe line, it is necessary to cut the interconnection layer or the solder-resist layer.

The batch resin-encapsulation method is a method in which the semiconductor devices for plural packages are resin-encapsulated in a single cavity at one time. In accordance with this batch resin-encapsulation method, the encapsulating resin encapsulating the semiconductor devices for the plural packages is formed in a single flat panel-shape unit, which is so called as a package panel. It is, therefore, necessary to divide the package panel into plural semiconductor packages by dicing process. Side faces of the individual semiconductor package are defined by cutting in the dicing process. The batch resin-encapsulation method for the transfer molding may be carried out either using a release film or without using any release film. FIGS. 1A through 1D are fragmentary cross sectional elevation views illustrative of top and bottom dies and plural semiconductor devices bonded on a circuit base member using the sequential steps involved in the conventional batch resin-encapsulation method for the transfer molding with a release film. Molding dies 120 comprise a top die 121 and a bottom die 122. The top die 121 further comprises a top center block 24. The bottom die 122 further comprises a bottom center block 25 and a circuit base member mounting block 142. The bottom center block 25 is provided with a pot 27 which is to be filled with a resin 26. In the pot 27, the resin 26 is filled and further a plunger 28 is inserted for applying a pressure to the resin 26. The top center block 24 is provided with a caliber 29 at a position corresponding to the pot 27. Runners 30 as passages to a top cavity 23 for the molten resin 26 are formed in both sides of the caliber 29. The top die 121 has the top cavity 23a which accommodates plural semiconductor devices 12 bonded on the circuit base member 111, wherein the molten resin 26 is injected into the cavity 26 for encapsulating the semiconductor devices with the resin 26. The runners 30 formed in both sides of the caliber 29 are connected with a first side of the cavity 23a adjacent to the top center block 24. An air vent 146 is formed in a second side of the cavity 23a opposite to the first side. The air vent 146 relieves an inner gas in the cavity 23a upon injection of the molten resin into the cavity 23a. The air vent 146 comprises a channel groove formed in a cramp face of the top die 121. The bottom die 122 has a bottom cavity 23b at a corresponding position to the top cavity 23a of the top die 121. The bottom cavity 23b accommodates the circuit base member 111. The top and bottom cavities 23a and 23b form a closed or sealed cavity for sealing the circuit base member 111 and the semiconductor devices 12. The circuit base member 111 is mounted on the circuit base member mounting block 142. The circuit base member mounting block 142 is depressed from a circumferential block to form the bottom cavity 23b for accommodating the circuit base member 111. The circuit base member mounting block 142 is supported to be movable in up and down directions by a floating mechanism utilizing a spring member 43. The movements in up and down directions of the circuit base member mounting block 142 cause variation in depth of the bottom cavity 23b. The floating mechanism is needed for a board type circuit base member which is variable in thickness. If the floating mechanism is not used, then the bottom cavity 23b is kept in depth. Notwithstanding, if the thickness-variable circuit board is mounted on the circuit base member mounting block 142, this means that the surface level of the thickness-variable circuit board is thus variable. If the thickness of the circuit board mounted on the bottom cavity 23b is too thick relative to the fixed depth of the bottom cavity 23b, then an excess cramping pressure is applied to the board, whereby the board receives a damage. If the thickness of the circuit board mounted on the bottom cavity 23b is too thin relative to the fixed depth of the bottom cavity 23b, then an insufficient cramping pressure is applied to the board and a gap is formed, whereby a leakage of the molten resin from the gap appears. The floating mechanism is provided to solve the above problems caused by the variation in thickness of the circuit board. If the tape type circuit base member 111 is used, then the floating mechanism is not needed because the tape type circuit base member 111 is thin and variation in thickness of the tape type circuit base member ill is so small and causes no problem.

The top die 121 has an adsorption hole 44 for vacuum-adsorbing a release film. The adsorption hole 44 has an opening 44a adjacent to the top cavity 23a. The adsorption hole 44 provides a connection between the top cavity 23a and a non-illustrated external vacuum source. If no release film is needed or the dies, then it is unnecessary to provide the adsorption hole 44.

The resin molding machine not illustrated is provided with the dies 120. The resin molding machine further has a top base not illustrated for supporting the top die 121 and a bottom base not illustrated for supporting the bottom die 122 as well as has a heater not illustrated for heating the dies 120, a vacuum pump not illustrated and serving as a vacuum source and a cramping mechanism not illustrated and further an injection mechanism not illustrated. The resin molding machine further more has a plunger 28. The top and bottom dies 121 and 122 are fixed to the top and bottom bases by plates or volts respectively. The top base or the bottom base is elevated for closing motions of the dies 120.

The conventional batch resin molding method for molding the semiconductor devices and the method of forming the semiconductor devices will be described.

[Bonding Process]

A bonding process occurs prior to the resin-molding process. In the bonding process, semiconductor devices 12 for plural packages are arranged in matrix over a main face of a single circuit base member 111 and then bonded to the single circuit base member 111. The semiconductor devices 12 are wire-bonded to the single circuit base member 111. In FIGS. 1A, 1B and 1C, each of the semiconductor devices 12 is wire-bonded to the single circuit base member 111 by bonding wires 16. It is, however, possible that the semiconductor devices 12 are wireless-bonded to the single circuit base member 111, for example, by use of bumps. In any event, the semiconductor devices 12 are bonded to the single circuit base member 111.

[Pre-Cramping Process]

A pre-cramping process will be described with reference to FIG. 1A. The pre-cramping process is made following to the above bonding process. The circuit base member Ill is mounted on the circuit base member mounting block 142 of the bottom die 122. A release film 41 is placed so as to cover the top cavity 23a, the caliber 29 and the runners 30, wherein the release film 41 is vacuum-adsorbed onto the surface of the top cavity 23a, so that the release film 41 extends along the inner face shape. As a result, the opening 44a of the adsorption hole 44 is sealed with the release film 41. However, the release film 41 is capable of permeation of gas. The gas is transmitted through the release film 41 at a low flow rate and suctioned into the adsorption hole 44. Namely, the gas flow into the adsorption hole 44 is not completely stopped. The release film 41 makes it easy to release the molded resin 26 from the inner wall of the dies. If the release film 41 is not used, it is alternatively necessary to provide a pin in the holding part, so that the injection mechanism causes the pin to push the molded resin to release the molded resin from the inner wall of the dies, wherein a mold releasing agent may be periodically supplied to the inner wall of the top die 121, into which the molten resin 26 is injected for promoting the mold-release.

The circuit base member 111 and the release film 41 are heated by contacting with the dies 120 which have already been heated by the non-illustrated heater. Since the circuit base member 111 is heated from its back side, immediately after the circuit base member 111 is mounted on the circuit base member mounting block, a relatively large thermal expansion appears on the back side of the circuit base member 111, whereby the circuit base member 111 is bent or arched. This bending of the circuit base member 111 is, however, reduced upon a subsequent thermal equilibrium phenomenon. It is necessary to wait for the injection of the resin until disappearance of the bending of the circuit base member 111. Subsequently, a tablet type resin 26 is placed into the pot 27 of the bottom die 122.

[Cramping Process]

Subsequent to the pre-cramping process, the cramping process is made. The cramping process will be described with reference to FIG. 1B. The resin molding machine is operated to close the top and bottom dies 121 and 122 together for cramping the circuit base member 111 with the dies 120, wherein a circumferential portion of the circuit base member 111 is cramped by the top and bottom dies 121 and 122. The semiconductor device mounted region of the circuit base member 111 are not cramped directly and are confirmed in the cavity 23a.

[Resin Injection Process]

The resin 26 is melted and the molten resin 26 is then injected by the plunger 28, so that the molten resin 26 is supplied through the caliber 29 and the runners 30 to the cavity 23a, whereby the cavity 23a of the dies 120 is filled with the injected resin 6. At the same time, the inner gas in the cavity 23a is pushed out of the cavity 23a through the air vent 146.

[Resin-Thermosetting Process]

After the dies 120 are filled with the resin 26, then the resin 26 is subjected to thermosetting, wherein the resin 26 comprises a thermosetting resin composition, whereby a package panel is completed. The dies 120 are opened for allowing the package panel with the release film 41 to be released from the dies 120 and further the used release film 41 is also removed from the package panel 41.

[External Terminal Formation]

If necessary, the external terminals are formed. In case of the ball grid array packages, solder balls as the external terminals are provided on the back side of the circuit base member 111.

[Package Dicing Process]

Subsequently, a package dicing process is made by use of a dicing machine with a circular blade which rotates for an abrasive grain cutting to the package panel, whereby the package panel is divided into plural semiconductor packages, wherein the side faces of each of the semiconductor packages are defined by the cutting faces by the circular blade.

The above conventional technique has the following problems. As shown in FIG. 1B, the cramping process with the dies 120 is made, whereby the circuit base member 111 is confirmed in the dies 120. At this time, a low pressure of the adsorption hole 44 is effected through the release film 41 to the circuit base member 111, so that the circuit base member 111 is suctioned toward the top die 121, whereby a center region of the circuit base member 111 is floated and the highest portion of the looped bonding wires 16 may be made into contact with the release film 41. This case will be referred to as a mode 1. As shown in FIG. 1C, the molten resin 26 is injected into the cavity 23a under high pressure, whereby one side of the circuit base member at the most deep portion of the cavity 23a is wrinkled and floated toward the top die 121. As a result, the highest portion of the looped bonding wires 16 may be made into contact with the release film 41. This case will be referred to as a mode 2.

In accordance with the investigations of the present inventors, it was confirmed that in case of the board type circuit base member 111, the above mode 1 is likely to appear, while in case of the tape type circuit base member 111, the above mode 2 is likely to appear.

The contact of the bonding wires 16 to the release film 41 provides a mechanical stress to the bonding wires 16 and causes undesirable deformation of the bonding wires 16. If a contact mark remains on the release film 41 and the resin molding is carried out, then the contact mark is transferred to the surface of the package panel, causing an appearance-defect of the semiconductor package. Such a semiconductor package is defective product and removed from the production line. Also, a semiconductor package with the contact mark may incorrectly be recognized so that the bonding wires are exposed or projected and the resin molding is improper, and then the semiconductor package is removed from the production line. Even if the semiconductor package is functionally okay, it is still difficult to deliver the semiconductor package to the client.

Japanese laid-open patent publication No. 8-142106 discloses that in order to prevent the floating of the circuit board, a vacuum adsorption is made to the circuit base member. It was confirmed by the present inventors that if the lower pressure effected by the release film adsorption means to the front surface of the circuit base member exceeds the low pressure effected by the circuit base member adsorption means to the back face of the circuit base member, then the circuit base member is floated in the mode 1.

If the circuit base member 111 is of the board type or the substrate type, the circuit base member mounting block 142 shows a floating motion, for which reason it is necessary to provide gaps between the circuit base member mounting block 142 and other blocks adjacent to the circuit base member mounting block 142. The gaps. However, cause leakage of vacuum, whereby the adsorption force effected to the back face of the board or substrate 111 is reduced. As a result, the circuit base member 111 is floated in the mode 1.

In the above Japanese laid-open patent publication No. 8-142106, it is also disclosed that the resin-molding machine is capable of resin-molding the plural semiconductor devices bonded to the plural substrates, wherein a peripheral region of the substrate around the semiconductor device is hold and cramped, so that it a substantive difference in pressure between the front and back sides of the substrate appears, the up and down movement of the substrate is not so large as the bonding wires or the semiconductor device are made into contact with the release film, whereby the above problems are not caused. The Japanese publication addresses that the vacuum adsorption to the substrate or board is made in order to suction the substrate or board and place the same on the top die before the cramping operation. The Japanese publication is silent on what the substrate or board is held after the cramping operation. The Japanese publication does not disclose nor teach the batch resin encapsulating technique for resin-molding the semiconductor devices for plural packages bonded on the single circuit base member. Accordingly, the Japanese publication provides no solution to solve the above problems engaged with the batch resin encapsulating technique.

If the above conventional technique disclosed in the above Japanese publication is applied to the resin-molding for the semiconductor devices for plural packages, the single circuit base member is first divided into the plural substrates before the resin-molding process is carried out to the individual resin-molding, wherein the peripheral region of the individual substrate is cramped. Accordingly, the conventional technique is independent from the above described serious problems engaged with the batch resin encapsulating technique.

In the above circumstances, it had been required to develop a novel resin-molding method and resin-molding dies as well as circuit base member free from the above problems.

SUMMARY OF THE INVENTION

Accordingly, it is an object of the present invention to provide a novel resin-molding method free from the above problems.

It is a further object of the present invention to provide a novel resin-molding method in the transfer mold technique to carry out the batch resin molding to the semiconductor devices for plural packages bonded on the single circuit base member in the single cavity of the molding dies, wherein the circuit base member is prevented from floating from the inner wall of the resin-molding dies to realize a high yield of the non-defective semiconductor packages.

It is a still further object of the present invention to provide novel resin-molding dies used for the resin-molding method in the transfer mold technique to carry out the batch resin molding to the semiconductor devices for plural packages bonded on the single circuit base member in the single cavity of the molding dies, wherein the circuit base member is prevented from floating from the inner wall of the resin-molding dies to realize a high yield of the non-defective semiconductor packages.

It is yet a further object of the present invention to provide a novel circuit base member used for the resin-molding method in the transfer mold technique to carry out the batch resin molding to the semiconductor devices for plural packages bonded on the single circuit base member in the single cavity of the molding dies, wherein the circuit base member is prevented from floating from the inner wall of the resin-molding dies to realize a high yield of the non-defective semiconductor packages.

The present invention provides a resin-molding method comprising the steps of: placing a circuit base member onto a mounting face of first one of paired dies, wherein a back face of the circuit base member is in contact with the mounting face placing the paired dies in a closing state for clamping a peripheral region of the circuit base member with the paired dies; and injecting a molten resin into a cavity of the paired dies for filling the cavity with the injected resin, wherein, in the closing state, a first pressure effected to a front face of the circuit base member is set higher in pressure level than a second pressure effected to the back face of the circuit base member, so as to secure the circuit base member to the mounting face.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

Figure 1A:
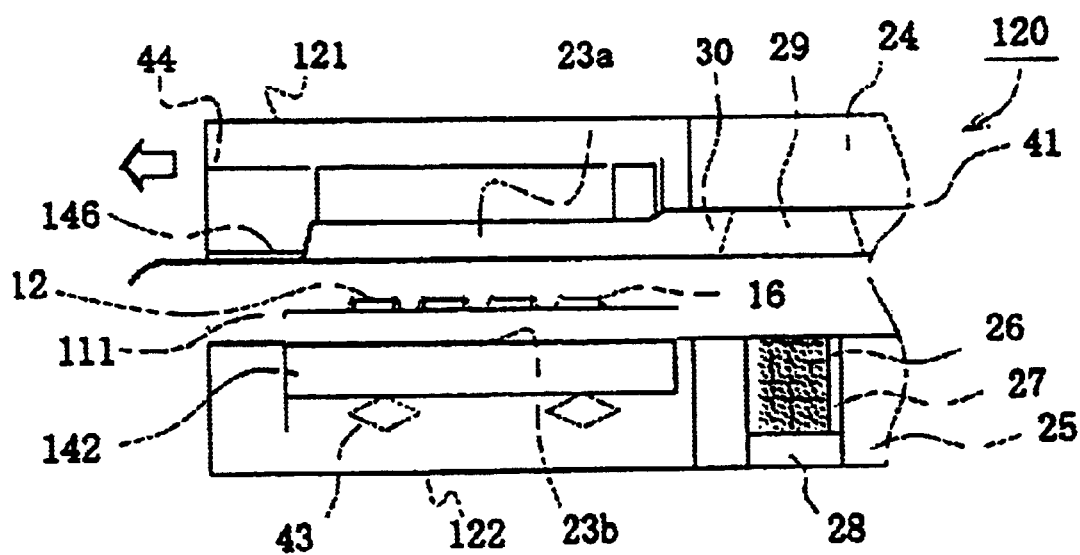
FIGS. 1A through 1D are fragmentary cross sectional elevation views illustrative of top and bottom dies and plural semiconductor devices bonded on a circuit base member in sequential steps involved in the conventional batch resin-encapsulation method for the transfer molding with use of the release film.
Figure 1B:
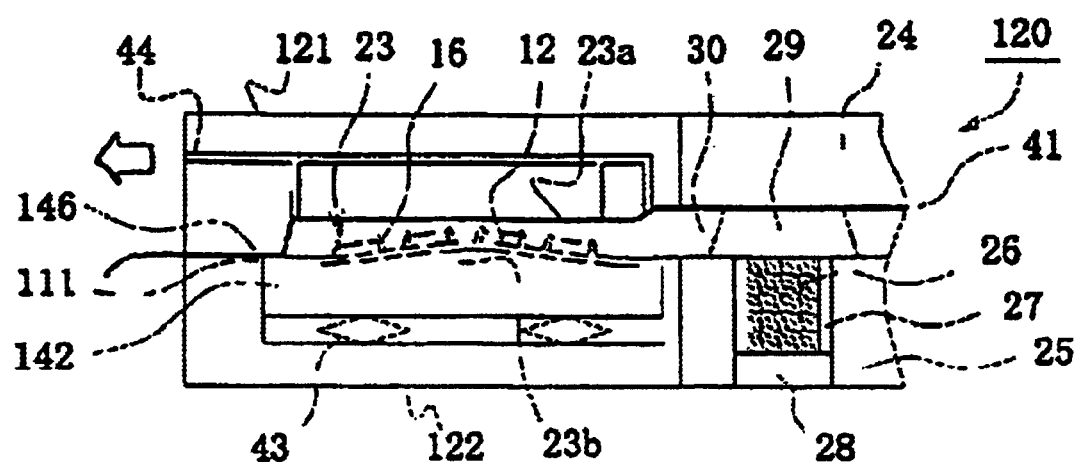

The present invention provides a resin-molding method comprising the steps of: placing a circuit base member onto a mounting face of a first of paired dies, wherein a back face of the circuit base member is in contact with the mounting face; placing the paired dies in a closing state for clamping a peripheral region of the circuit base member with the paired dies; and injecting a molten resin into a cavity of the paired dies for filling the cavity with the injected resin, wherein, in the closing state, the pressure effected to a front face of the circuit base member is set higher in pressure level than the pressure effected to the back face of the circuit base member, so as to secure the circuit base member to the mounting face.

It is preferable that at least a first type adsorption hole is formed in the first one of the paired dies for adsorbing the circuit base member onto the mounting face, and at least a second type adsorption hole is formed in second one of the paired dies for adsorbing a release film onto the second one of the paired dies.

It is further preferable that a pressure level of the first type adsorption hole for adsorbing the circuit base member onto the mounting face is lower than a pressure level of the second type adsorption hole for adsorbing the release film onto the second one of the paired dies.

It is also preferable that a plurality of the first type adsorption hole are formed at least in a peripheral region of the mounting face for absorbing a peripheral region of the circuit base member onto the peripheral region of the mounting face.

It is further preferable that the plural first type adsorption holes are further formed in a center region of the mounting face surrounded by the peripheral region of the mounting face for absorbing not only the peripheral region but also a center region of the circuit base member onto the mounting face.

It is further preferable that the mounting face has a rectangle shape, and the plural first type adsorption holes are distributed uniformly and symmetrically with reference to both a longitudinal center axis and a horizontal center axis perpendicular to the longitudinal center axis.

It is also preferable that the mounting face is formed on a mounting block which is movable in up and down directions.

It is preferable that the circuit base member comprises a circuit board.

It is preferable that the circuit base member comprises a circuit tape.

It is preferable that the circuit base member is bonded with a plurality of semiconductor devices and the resin-molding method forms a resin-molding package panel including a plurality of resin-molded semiconductor packages.

It is preferable that a high pressure gas is injected into the cavity for securing the circuit base member onto the mounding face.

It is preferable that the back face of the circuit base member has at least an adsorption groove.

It is further preferable that the adsorption grooves extend over inter-regions between plural circuit base member units in array.

It is further more preferable that the adsorption grooves further extend continuously to a peripheral region surrounding the plural circuit base member units in array.

It is moreover preferable that the first type adsorption holes are formed in corresponding positions to the adsorption grooves.

The present invention also provides a combination of resin molding dies comprising: a first die having a mounting face on which a circuit base member is mounted, wherein a back face of the circuit base member is in contact with the mounting face; and a second die having a gate in a first side and a dummy cavity in a second side opposite to the first side.

It is preferable that at least a first type adsorption hole is formed in the first die for adsorbing the circuit base member onto the mounting face, and at least a second type adsorption hole is formed in the second die for adsorbing a release film onto the second one of the paired dies.

It is also preferable that a pressure level of the first type adsorption hole for adsorbing the circuit base member onto the mounting face is lower than a pressure level of the second type adsorption hole for adsorbing the release film onto the second die.

It is further preferable that a plurality of the first type adsorption hole are formed at least in a peripheral region of the mounting face for absorbing a peripheral region of the circuit base member onto the peripheral region of the mounting face.

It is further more preferable that the plural first type adsorption holes are further formed in a center region of the mounting face surrounded by the peripheral region of the mounting face for absorbing not only the peripheral region but also a center region of the circuit base member onto the mounting face.

It is moreover preferable that the mounting face has a rectangle shape, and the plural first type adsorption holes are distributed uniformly and symmetrically with reference to both a longitudinal center axis and a horizontal center axis perpendicular to the longitudinal center axis.

It is also preferable that the mounting face is formed on a mounting block which is movable in up and down directions.

It is also preferable that the circuit base member comprises a circuit board.

It is also preferable that the circuit base member comprises a circuit tape.

It is also preferable that the circuit base member is bonded with a plurality of semiconductor devices and the resin-molding method forms a resin-molding package panel including a plurality of resin-molded semiconductor packages.

It is also preferable that a high pressure gas is injected into the cavity for securing the circuit base member onto the mounding face.

It is preferable that the back face of the circuit base member has at least an adsorption groove.

It is further preferable that the adsorption grooves extend over inter-regions between plural circuit base member units in array.

It is further more preferable that the adsorption grooves further extend continuously to a peripheral region surrounding the plural circuit base member units in away.

It is moreover preferable that the first type adsorption holes are formed in corresponding positions to the adsorption grooves.

PREFERRED EMBODIMENT

A first embodiment according to the present invention will be described in detail with reference to the drawings. A first novel resin-molding method, first novel molding dies and a first novel circuit base member will be described. The descriptions will be made in the order of the circuit board as the circuit base member, the molding dies, the resin molding machine and the manufacturing processes.

Figure 2A:
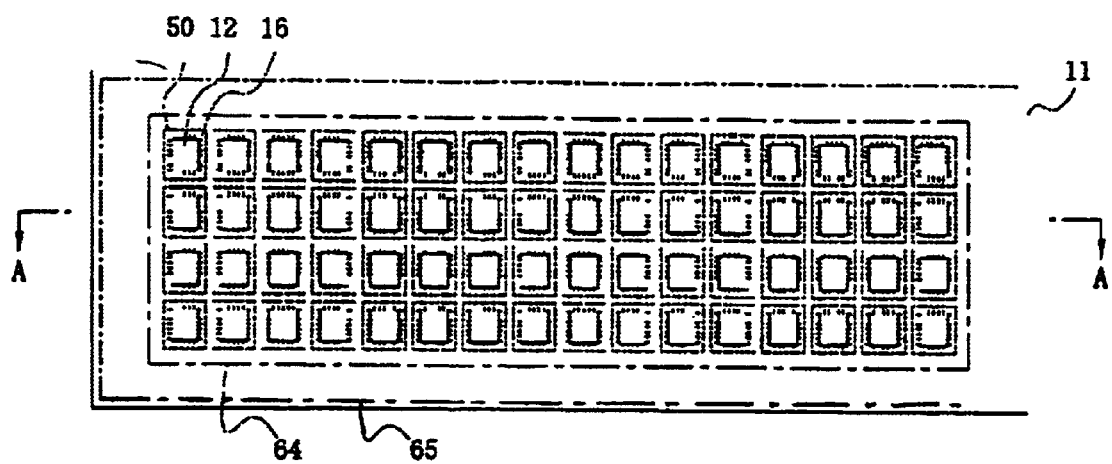
FIG. 2A is a fragmentary front view illustrative of a novel circuit board in the first embodiment in accordance with the present invention.
Figure 2B:
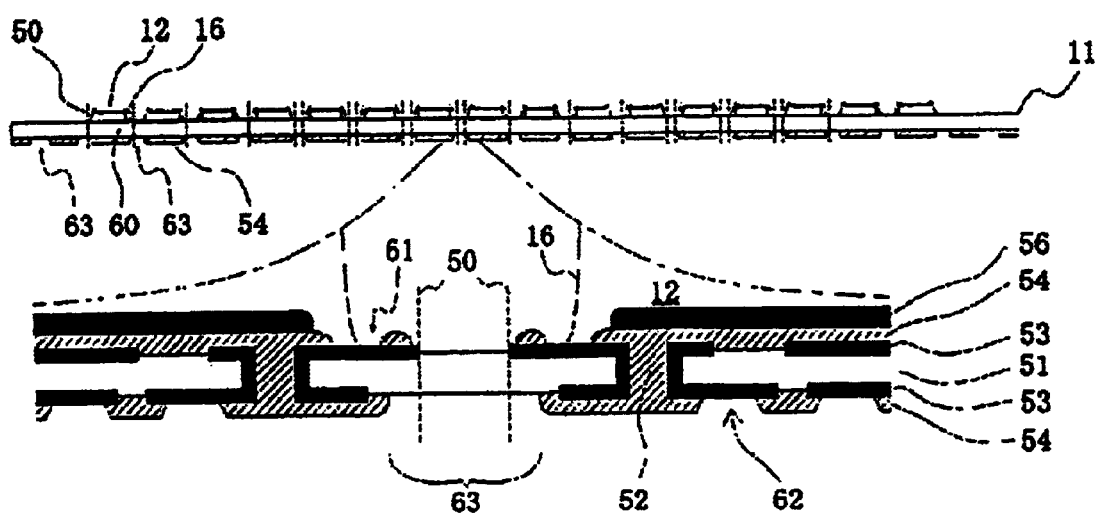
FIG. 2B is a fragmentary cross sectional elevation view taken along an A—A line in FIG. 2A of the novel circuit board with a partial enlargement view in the first embodiment in accordance with the present invention.
Figure 2C:
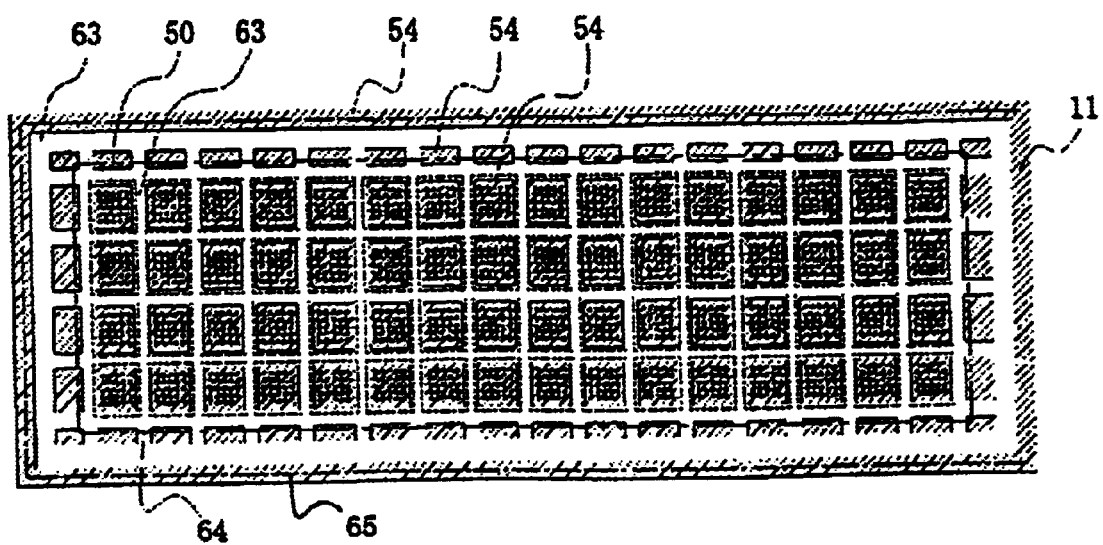
FIG. 2C is a fragmentary front view illustrative of the novel circuit board of FIG. 2A in the first embodiment in accordance with the present invention.

The circuit board 11 of this embodiment comprises a glass epoxy resin board with a metal foil circuit pattern. FIG. 2A is a fragmentary front view illustrative of a novel circuit board in the first embodiment in accordance with the present invention. FIG. 2B is a fragmentary cross sectional elevation view taken along an A—A line in FIG. 2A of the novel circuit board with a partial enlargement view in the first embodiment in accordance with the present invention. FIG. 2C is a fragmentary front view illustrative of the novel circuit board of FIG. 2A in the first embodiment in accordance with the present invention.

The circuit board 11 comprises a glass epoxy resin insulating board 51, copper wirings 53, and solder resists 54. The insulating board 51 has through holes 52 which penetrate the insulating board 51, so that the front face and the back face are connected through the through holes 52. The copper wirings 53 having a predetermined pattern are provided on the front and back faces of the insulating board 51 and within the through holes 52. Wire bonding portions 61 of the copper wirings 53 are positioned on the front face of the insulating board 51. External terminal bonding land portions 62 are also positioned on the back face of the insulating board 51. The through holes 52 allow electrical connections between the wire bonding portions 61 and the external terminal bonding land portions 62.

The front face of the circuit board 11 is coated with the solder resist 54 except over the wire bonding portions 61 of the copper wirings 53. A semiconductor device 12 is boned onto the front face of the circuit board 11. The semiconductor device 12 is boned via a 56 bonding agent to the die bond region of the front face of the circuit board 11, so that non-illustrated electrodes of the semiconductor device 12 are electrically connected through bonding wires 16 to the copper wirings 53 of the copper wirings 53.

The back face of the circuit board 11 is coated with the solder resist 54 except over the external terminal bonding land portions 62 of the copper wirings 53 and adsorption grooves 63. The external terminal bonding land portions 62 comprises uncoated parts of the copper wirings 53, wherein the uncoated parts of the copper wirings 53 are positioned under openings of the solder resist 54. The adsorption grooves 63 comprise exposed parts of the insulating substrate 51, wherein the exposed parts of the insulating substrate 51 are positioned under openings of the solder resist 54. The bottoms of the adsorption grooves 63 comprise the back face of the insulating substrate 51. The depth of the adsorption grooves 63 is defined by a thickness of the solder resist 54. Namely, the insulating substrate 51 and the copper wirings 53 are selectively coated by the solder resist 54.

The circuit board 11 has a matrix array of circuit board units 60, each of which is surrounded by a circumferential region 50, wherein the each circuit board unit 60 corresponds to the single semiconductor package. The each circuit board unit 60 has the same pattern of the copper wirings 53, A broken line 64 in FIGS. 2A and 2C represent the boundary lines between an array region of the circuit board units 60 and a peripheral region of the circuit base member, wherein the array region of the circuit board units 60 is encompassed by the broken line 64, while the peripheral region of the circuit base member extends outside the broken line 64. As shown in FIGS. 2A and 2C, a broken line 65 represents a boundary line which bounds a cramped region and an uncramped mold region, wherein the cramped region is cramped between the top and bottom dies 21 and 22 of the dies 20. The mold region is confined in the cavity region which comprises a gate 31, a cavity 23a and a dummy cavity 32, whereby the mold region is molded.

A peripheral region of the solder resist 54 provided on the back face of the circuit board unit 60 is positioned inside of the circumference region 50 of the semiconductor package. In the array region of the circuit board units 60, no solder resist is applied on the region between the circumference of the solder resist and the circumference 50 of the package and also the region outside of the circumference 50 of the package, but the insulating substrate 51 is exposed. As a result, the back faces of the circuit board units 60 have the exposed peripheral region of the insulating substrate 51, wherein the exposed peripheral region is uncoated with the solder resist, so as to prevent that a dicing blade is made into contact with the solder resist 54 on the back face of the circuit board 11. Since the blade is not contact with the solder resist 54 on the back face of the circuit board 11, no crack appears on the solder resist 54.

In this embodiment, the adsorption groove 63 comprises the groove formed by the exposed part of the insulating substrate 51 which is positioned under the opening of the solder resist around the each circuit substrate unit 60. The adsorption groove 63 continuously extends in the circuit board peripheral region. The layout of the circuit substrate units 60 in the array region depends upon the external size or dimension of the circuit substrate units 60, but the positions of the adsorption grooves 63 formed in the circuit board peripheral region remain unchanged independently from the external size or dimension of the circuit substrate units 60 for the purpose of standardization.

Figure 3A:
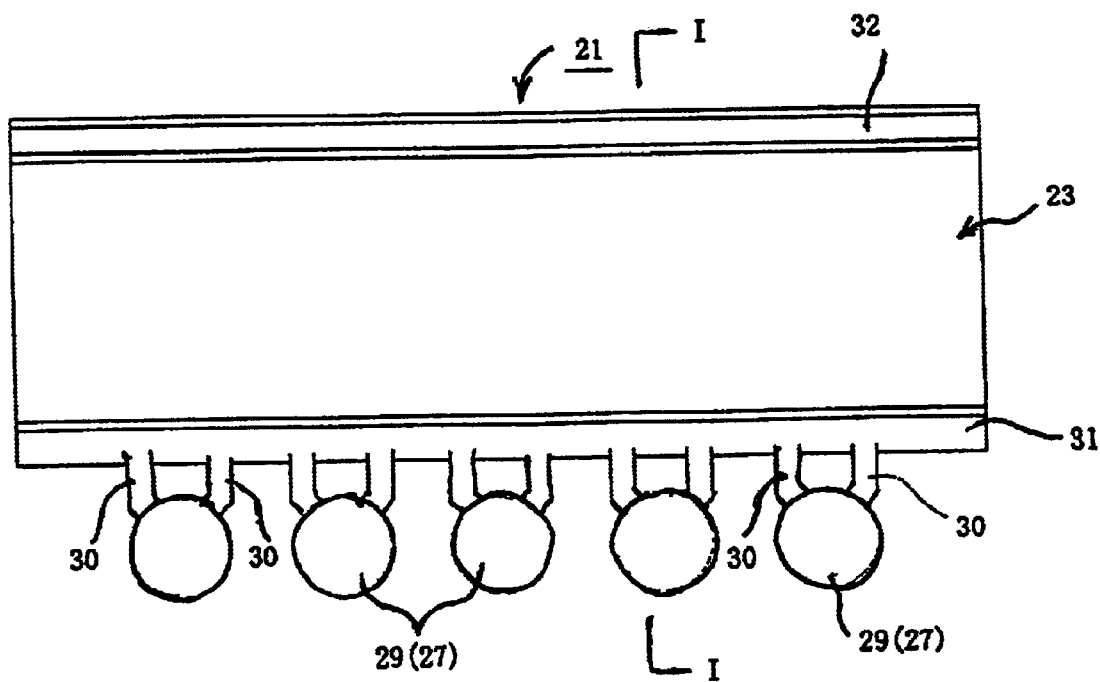
FIG. 3A is a plane view illustrative of the novel dies in the first embodiment in accordance with the present invention.
Figure 3B:
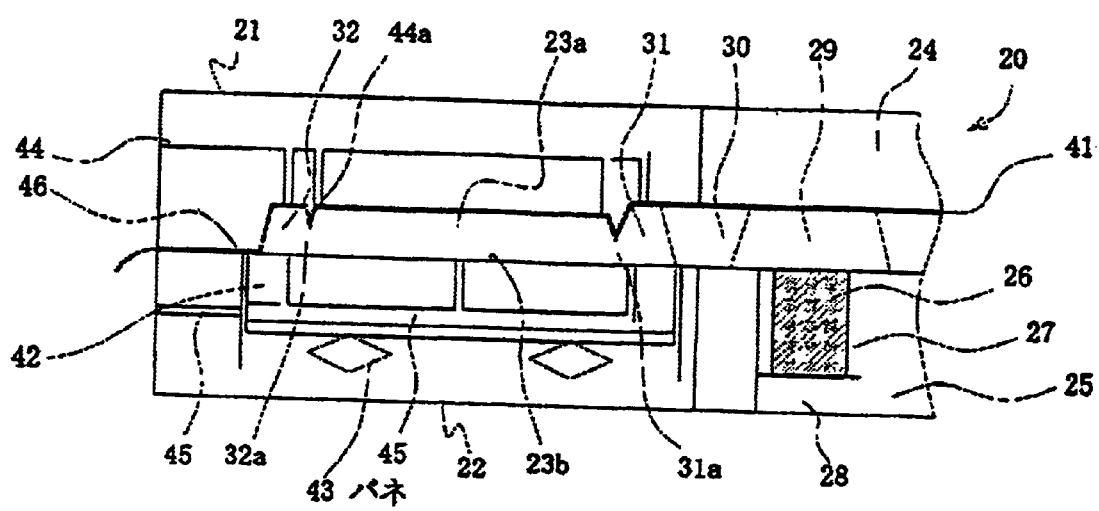
FIG. 3B is a fragmentary cross sectional elevation view illustrative of the dies taken along an I—I line of FIG. 3A in the first embodiment in accordance with the present invention.
Figure 3C:
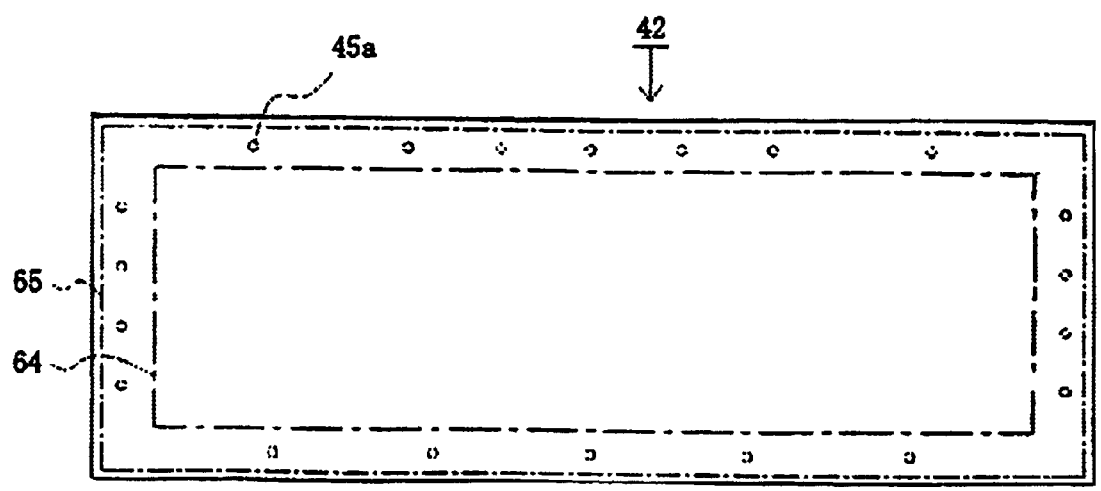
FIG. 3C is a view illustrative of the circuit board mounting block of the dies of FIG. 3A in the first embodiment in accordance with the present invention. The dies 20 are for the transfer molding.
Figure 4A:
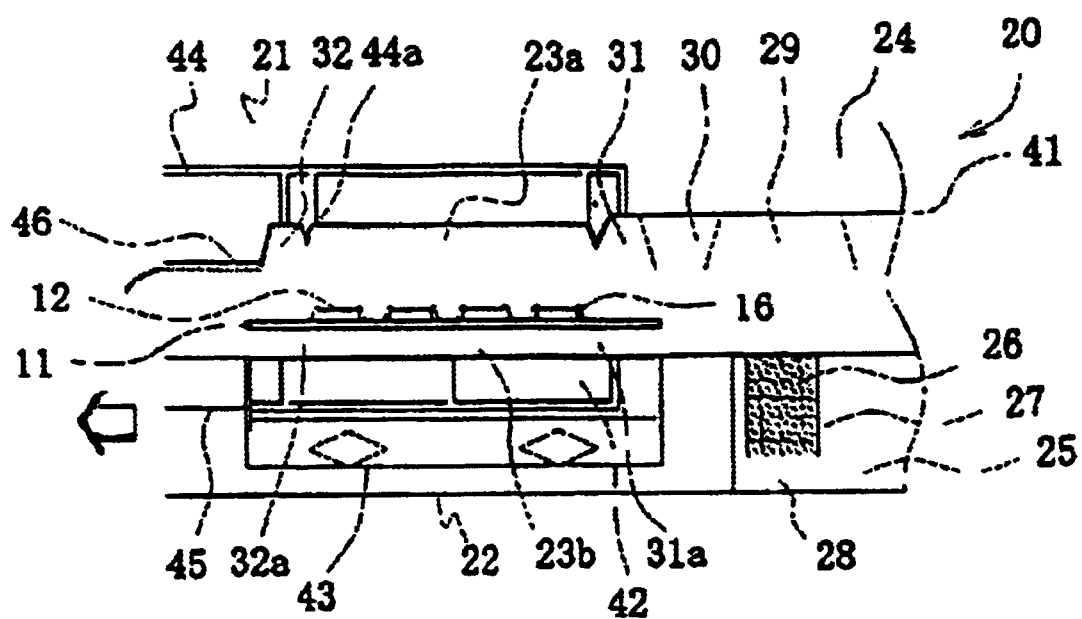
FIGS. 4A through 4D are fragmentary cross sectional elevation views illustrative of top and bottom dies and plural semiconductor devices bonded on a circuit base member in sequential steps involved in the novel batch resin-encapsulation method for the transfer molding with use of the release film in a first embodiment in accordance with the present invention.
Figure 4B:
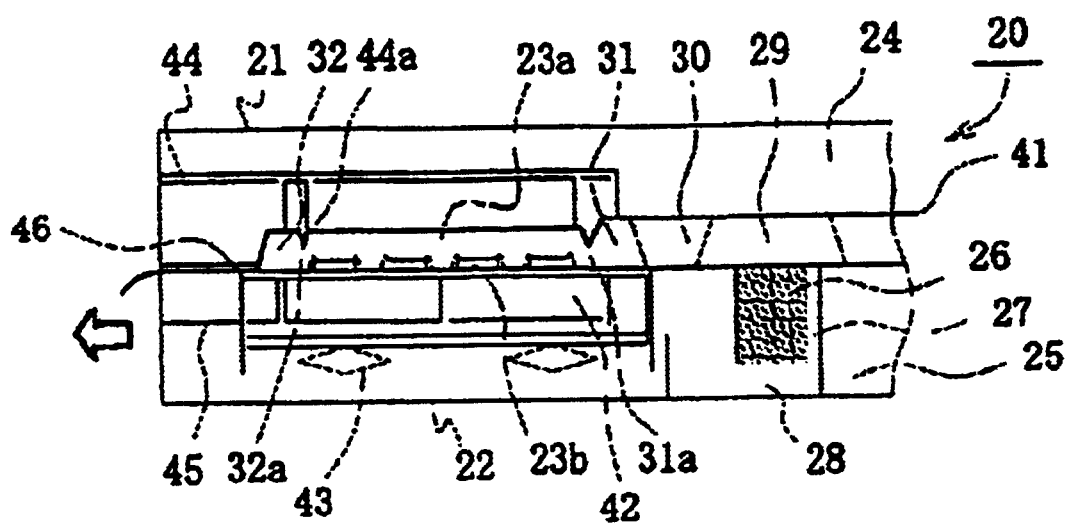
Figure 4C:
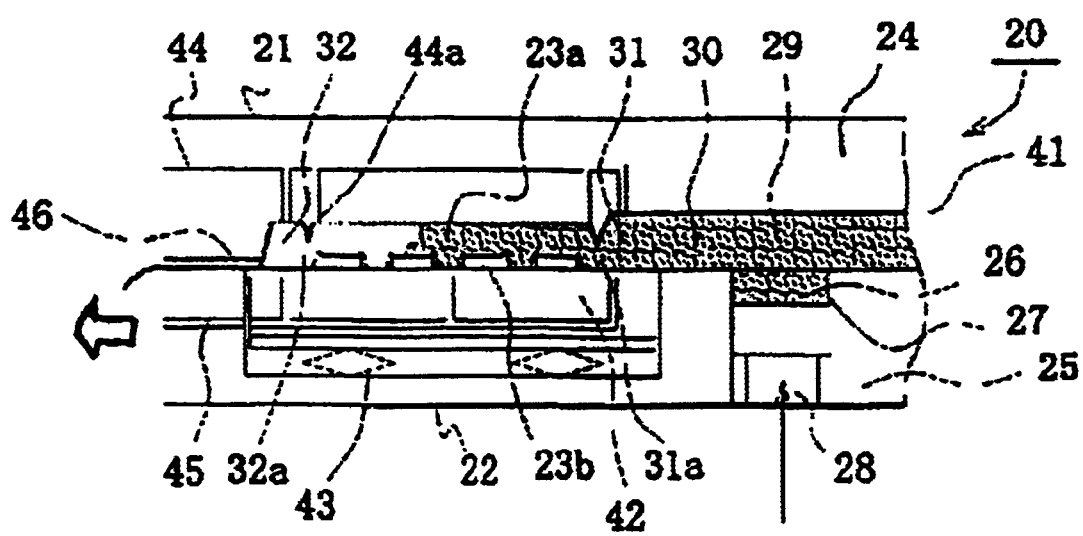
Figure 4D:
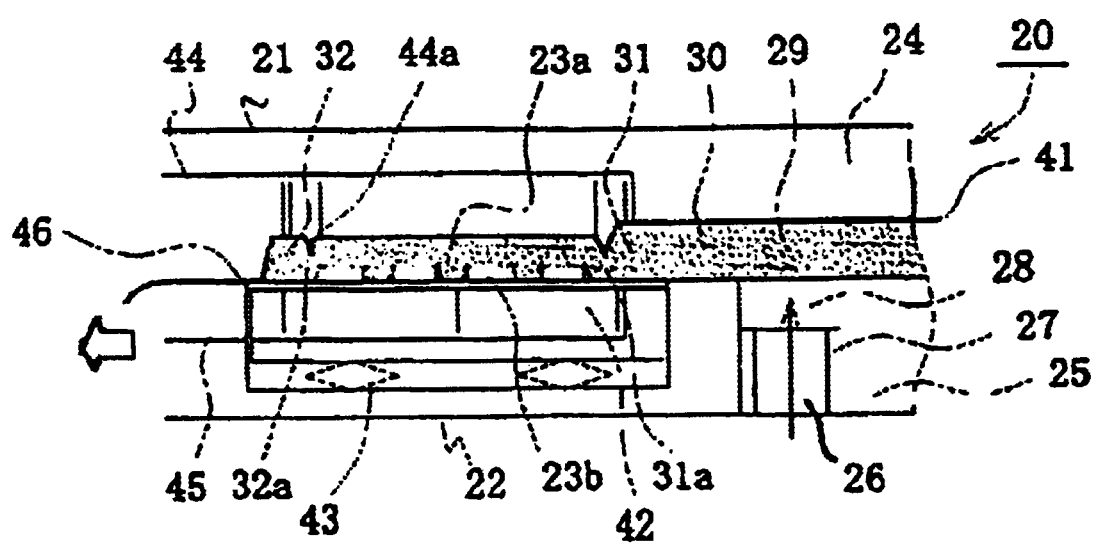

FIG. 3A is a plane view illustrative of the novel dies in the first embodiment in accordance with the present invention. FIG. 3B is a fragmentary cross sectional elevation view illustrative of the dies taken along an I—I line of FIG. 3A in the first embodiment in accordance with the present invention. FIG. 3C is a view illustrative of the circuit board mounting block of the dies of FIG. 3A in the first embodiment in accordance with the present invention. The dies 20 are for the transfer molding. As shown in FIG. 3B, the dies 20 comprise a top die 21 and a bottom die 22. The top die 21 has a top die center block 24. The bottom die 22 has a bottom die center block 25 and a circuit board mounting block 42. The bottom die center block 25 and he top die center block 24 have the same structures as described in the prior art. The bottom die center block 25 is provided with a pot 27, into which a molten resin 26 is filled. A plunger 28 is inserted into the pot 27 for applying a pressure to the molten resin 26 in the pot 27. The top die center block 24 is provided with a caliber 29 at a corresponding position to the pot. In opposite sides of the caliber 29, runners 30 are provided as flow passages for flowing the molten resin 26 to the cavity 23*a*.

In each side of the top die center block 24 of the top die 21, a gate 31, a cavity 23*a*, a dummy cavity 32 are formed in this order. The cavity 23*a* accommodates a semiconductor device 12 bonded onto a circuit board 11. The cavity 23 receives an injection of the molten resin 26 for molding the semiconductor device 12 with the resin 26. The gate 31 serves as a port for the cavity 23*a* and is connected with the runner 30. The cavity 23*a* extends two-dimensionally. In order to allow a uniform injection of the molten resin 26 over enter regions of the cavity 23*a*, the gate 31 is provided, which has a gap 31*a* which extends along a longitudinal side of the cavity 23*a* and in parallel to the longitudinal side, wherein the extending length of the gap 31*a* is almost equal to the cavity length. The gate 31 once pools the molten resin 26, which has been supplied through the caliber 29 and the runners 30 from the pot 27, so that the injection pressure is effected to the molten resin 26 but also the molten resin 26 is uniformly injected into the enter region of the cavity 23*a* even independently from any affection of the presence of the semiconductor device 21 in the cavity 23*a*.

If the size of the circuit boards 11 is uniform, it is possible to commonly use the same dies 20 for manufacturing the semiconductor packages different in the number or the size.

As shown in FIG. 3A, the plural runners 30 are aligned along the longitudinal side of the gate 31 and connected to the longitudinal side of the gate 31. Also the pots 27 and the calibers 29 are aligned at a constant pitch in parallel to the longitudinal side of the gate 31. Each of the pots 27 and the calibers 29 is connected through two runners 30 to the longitudinal side of the gate 31, 50 that the plural runners 30 are aligned at a constant pitch along the longitudinal side of the gate 31, whereby the uniform injection of the molten resin 26 through the uniformly distributed runners 30 to the lengthily extending gate 31 and further into the cavity 23 from the longitudinal side thereof.

Further, a dummy cavity 32 is provided which extends an opposite longitudinal side of the cavity 23 to the gate 31. The dummy cavity 32 is separated via a gap 32*a* from the opposite longitudinal side of the cavity 23, wherein the gap 32*a* extends along the opposite longitudinal side of the cavity 23 and between the dummy cavity 32 and the cavity 23. The gap 32*a* extends in the same length as the longitudinal side of the cavity 23. The dummy cavity 32 is provided in the opposite longitudinal side of the cavity 23 to the gate 31, so that the molten resin 26 is injected through the gate 31 to the cavity 23 and finally reaches the dummy gate 32, whereby the molten resin 26 is smoothly flown without returning from the opposite longitudinal side. This dummy cavity 31 also ensures the almost uniform injection of the molten resin 26 into the cavity 23 without disturbing the smooth flow of the injected molten resin 26 by the presence of the semiconductor device 12 bonded on the circuit substrate 11 and also presence of the bonding wires 16. As a result, no incomplete filling of the molten resin 26 in the cavity 23 nor displacement of the bonding wires 16 by the injected molten resin 26 appear. If contrary to the present invention, no dummy cavity is provided along the opposite longitudinal side of the cavity 23 to the gate 31, then the smooth follow of the injected molten resin 26 is terminated at the opposite longitudinal side of the cavity 23 and then returns from the opposite longitudinal side of the cavity 23, 50 that the returned molten resin 26 is flown in the reverse direction to a non-injected part in the cavity 23, wherein the non-injected part is the part where the injected molten resin 26 has not yet reached. The returned molted resin 26 in the reverse direction is then collided with the injected molten resin 26 in the normal direction, where the displacement of the bonding wires 16 and/or formation of voids may appear. In accordance with the present invention, the dummy cavity 32 is provided in the opposite longitudinal side of the cavity 23 to as to make the dies 20 free from the above problems.

An air vent 46 is provided in the dummy cavity side for allowing the internal gas in the cavity 23*a* to be discharged in the injection of the molten resin 26. The air vent 46 comprises a channel groove formed on the cramping face of the top die 21.

The bottom die 22 is provided with a bottom die cavity 23*b*, which extends corresponding regions to the cavity 23*a* and the dummy cavity 32 of the top die 21. The bottom die cavity 23*b* accommodates the circuit board 11. Namely, the dies 20 have a cavity 20 which comprises the top die cavity 23*a* and the bottom die cavity 23*b* and which accommodates in tight-seal the circuit board 11 and the bonded semiconductor devise 12 thereon. The circuit substrate 11 is mounted on the circuit board mounting block 42 of the bottom die 22. The circuit board mounting block 42 is depressed from a circumferential block to form the bottom cavity 23*b* for accommodating the circuit board 11. The circuit board mounting block 42 is supported to be movable in up and down directions by a floating mechanism utilizing a spring member 43. The movements in up and down directions of the circuit board mounting block 42 cause variation in depth of the bottom cavity 23*b*. The floating mechanism is needed for a board type circuit base member which is variable in thickness. If the floating mechanism is not used, then the bottom cavity 23b is kept in depth. Notwithstanding, if the thickness-variable circuit board is mounted on the circuit base member mounting block 42, this means that the surface level of the thickness-variable circuit board is thus variable. If the thickness of the circuit board mounted on the bottom cavity 23b is too thick relative to the fixed depth of the bottom cavity 23b, then an excess cramping pressure is applied to the board, whereby the board receives a damage. If the thickness of the circuit board mounted on the bottom cavity 23b is too thin relative to the fixed depth of the bottom cavity 23b, then an insufficient cramping pressure is applied to the board and a gap is formed, whereby a leakage of the molten resin from the gap appears. The floating mechanism is provided to solve the above problems caused by the variation in thickness of the circuit board. If the tape type circuit base member 11 is used, then the floating mechanism is not needed because the tape type circuit base member 11 is thin and variation in thickness of the tape type circuit base member 11 is so small as no problem.

The top die 21 has an adsorption hole 44 for vacuum-adsorbing a release film. The adsorption hole 44 has an opening 44a adjacent to the top cavity 23a. The adsorption hole 44 provides a connection between the top cavity 23a and a non-illustrated external vacuum source. If no release film is needed or the dies, then it is unnecessary to provide the adsorption hole 44.

The bottom die 22 has adsorption holes 45 for vacuum-adsorbing the circuit board 11. Each of the adsorption holes 45 have a first end which is connected to a non-illustrated external vacuum source and a second end which forms an opening 45a on the circuit board mounting face of the circuit board mounting block 42. As shown in FIG. 3C, the adsorption holes 45 are placed in a peripheral region defined between the broken lines 64 and 65 and also at corresponding positions to the adsorption groove 63, so that when the circuit board 11 is mounted on the circuit board mounting block 42, the openings 45a are connected with the adsorption groove 63 formed in the peripheral region. The diameter of the openings 45a are smaller than the width of the adsorption groove 63, so as to provide no damage to the solder resist in the adsorption.

The resin molding machine not illustrated is provided with the dies 20. The resin molding machine further has a top base not illustrated for supporting the top die 21 and a bottom base not illustrated for supporting the bottom die 22 as well as has a heater not illustrated for heating the dies 20, a vacuum pump not illustrated and serving as a vacuum source and a cramping mechanism not illustrated and further an injection mechanism not illustrated. The resin molding machine further more has a plunger 28. The top and bottom dies 121 and 122 are fixed to the top and bottom bases by plates or bolts respectively. The top base or the bottom base is elevated for closing motions of the dies 120.

The novel batch resin molding method for molding the semiconductor devices and the method of forming the semiconductor devices will be described. FIGS. 4A through 4D are fragmentary cross sectional elevation views illustrative of top and bottom dies and plural semiconductor devices bonded on a circuit base member in sequential steps involved in the novel batch resin-encapsulation method for the transfer molding with use of the release film in a first embodiment in accordance with the present invention.

[Bonding Process]

Figure 1C:
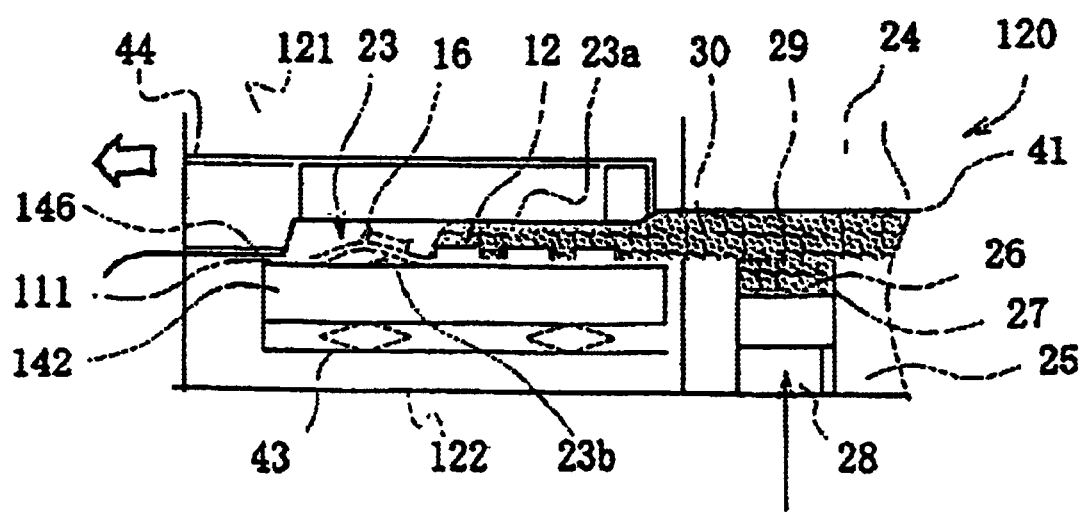
Figure 1D:
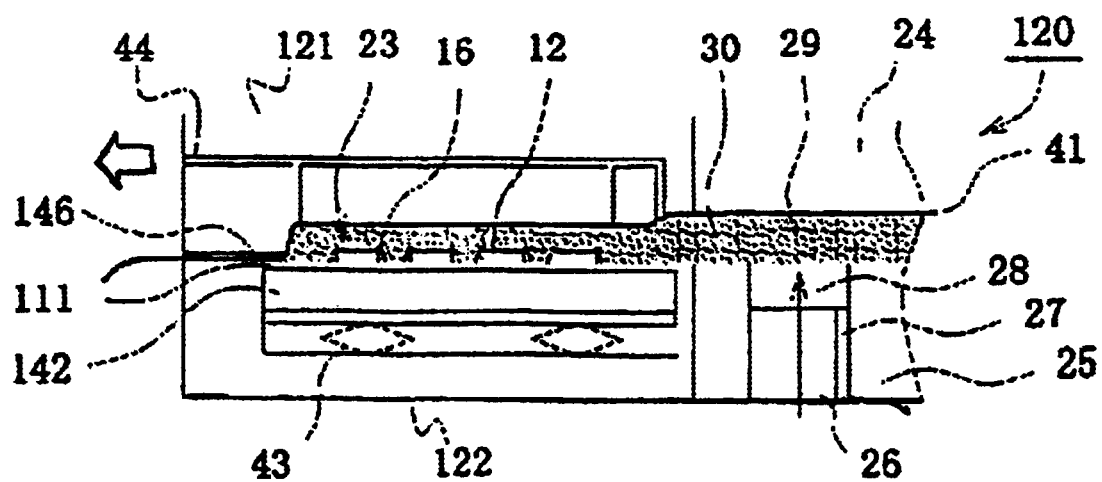

Prior to the resin-molding process, a bonding process is made. In the bonding process, semiconductor devices 12 for plural packages are arranged in matrix over a main face of a single circuit base member 11 and then bonded to the single circuit base member 11. The semiconductor devices 12 are wire-bonded to the single circuit base member 11. In FIGS. 2A, and 1C, each of the semiconductor devices 12 is wire-bonded to the single circuit base member 11 by bonding wires 16. It is, however, possible that the semiconductor devices 12 are wireless-bonded to the single circuit base member 11, for example, by use of bumps. In any event, the semiconductor devices 12 are bonded to the single circuit base member 11.

[Pre-Cramping Process]

A pre-cramping process will be described with reference to FIG. 1A. The pre-cramping process is made following to the above bonding process. The circuit board 11 is mounted on the circuit board mounting block 42 of the bottom die 22, whereby the openings 45a of the adsorption holes 45 are connected with the adsorption groove 63 formed in the back face of the circuit board 11. Namely, the adsorption groove 63 and the adsorption holes 45 are connected to each other. The vacuum operation is made through the adsorption holes 45, so that the pressure of the adsorption groove 63 connected with the adsorption holes 45 are reduced so that the circuit board 11 is adsorbed and fixed to the circuit board mounting face. As shown in FIG. 2C, the adsorption grooves 63 in the molding region are distributed at almost contact pitch in the longitudinal and horizontal directions, so that the uniform adsorption force effected to the enter region of he circuit board 11 is generated by the reduced pressure of the adsorption grooves 63.

Further, a release film 41 is placed so as to cover the dummy cavity 32, the top cavity 23a, the caliber 29 and the runners 30, wherein the release film 41 is vacuum-adsorbed onto the surface of the top cavity 23a through the adsorption holes 44, so that the release film 41 extends along the inner face shape of the top die 21. As a result, the openings 44a of the adsorption holes 44 are sealed with the release film 41. However, the release film 41 is capable of permeation of gas. The gas is transmitted through the release film 41 at a low flow rate and suctioned into the adsorption holes 44. Namely, the gas flow into the adsorption holes 44 is not completely stopped. The release film 41 makes it easy to release the molded resin 26 from the inner wall of the dies. If the release film 41 is not used, it is alternatively necessary to provide a pin in the holding part, so that the injection mechanism causes the pin to push the molded resin to release the molded resin from the inner wall of the dies, wherein a mold releasing agent may be periodically supplied to the inner wall of the top die 21, into which the molten resin 26 is injected for promoting the mold-release.

In order to prevent the circuit board 11 from floating, a pressure value is effected to the front of the circuit board 11 is set higher than a pressure value effected to the back face of the circuit board 11. The pressure is controlled by reduction. When the dies 20 are in the closing state, the reducing value in the pressure effected to the back face of the circuit board 11 is set higher than reducing value in the pressure effected to the front of the circuit board 11. Prior to the cramping operation, operations are made to a control valve for controlling an output and a degree of vacuum of the vacuum pump connected to the adsorption holes 44 and also to another control valve for controlling an output and a degree of vacuum of the vacuum pump connected to the adsorption holes 45, so that when the dies 20 are in the closing state, the reducing value in the pressure effected to the back face of the circuit board 11 is higher than reducing value in the pressure effected to the front of the circuit board 11. If it is difficult to detect the pressure value effected to the front and back faces of the circuit board 11, a first negative pressure value of one vacuum source for adsorbing the circuit board 11 and a second negative pressure value of another vacuum source for adsorbing the release film 41, so that the first negative pressure value is lower in level than the second negative pressure value. Otherwise, it is also possible that there are detected a first negative pressure value at a valve provided on a flow passage for adsorbing the circuit board 11 and being closest to the dies 20 and a second negative pressure value at a valve provided on a flow passage for adsorbing the release film 41 and being closest to the dies 20, so that the first negative pressure value is lower in level than the second negative pressure value. This prevents the circuit board 11 from flowing from the inner wall of the dies. This means that the bonding wires or other parts of the circuit board are never contact with the release film. As a result, no damage is provided to the parts such as the bonding wires of the semiconductor device, and the good-appearance semiconductor package can be obtained.

The circuit board 11 and the release film 41 are heated by contacting with the dies 20 which have already been heated by the non-illustrated heater. Since the circuit base board 11 is heated from its back side, immediately after the circuit board 11 is mounted on the circuit base member mounting block, a relatively large thermal expansion appears on the back side of the circuit board 11, whereby the circuit board 11 is bent or arched. This bending of the circuit board 11 is, however, reduced upon a subsequent thermal equilibrium phenomenon. It is necessary to wait for the injection of the resin until disappearance of the bending of the circuit board 11. Subsequently, a tablet type resin 26 is placed into the pot 27 of the bottom die 22.

[Cramping Process]

Subsequent to the pre-cramping process, the cramping process is made. The cramping process will be described with reference to FIG. 4B. The resin molding machine is operated to close the top and bottom dies 21 and 22 together for cramping the circuit board 11 with the dies 120, wherein a circumferential portion of the circuit board 11 is cramped by the top and bottom dies 21 and 22. The semiconductor device mounted region of the circuit board 11 is not cramped directly and are confirmed in the cavity 23a.

In the conventional resin-molding method, when the circuit base member 111 is confined in the dies 120, then the negative pressure from the adsorption holes 44 are effected through the release film 41 to the circuit base member 111, whereby the circuit base member 111 is adsorbed toward the top die 121, and the center region of the circuit base member 111 is floated from the surface of the circuit base member mounting block 142. In accordance with the novel resin-molding method, when the dies 20 are in the closing state, the negative pressure value effected to the back face of the circuit board 11 is lower in level than the negative pressure value effected to the front face of the circuit board 11, whereby no floating appears.

[Resin Injection Process]

The resin 26 is melt and the molten resin 26 is then injected by the plunger 28, so that the molten resin 26 is supplied through the calibers 29 and the runners 30 and the gate 31 to the cavity 23a, whereby the cavity 23a of the dies 20 is filled with the injected resin 26. At the same time, the inner gas in the cavity 23a is pushed out of the cavity 23a through the air vent 46.

In the conventional resin-molding method, when the molten resin 26 is injected into the cavity 23a under high pressure, whereby one side of the circuit base member at the most deep portion of the cavity 23a is wrinkled and floated toward the top die 121. As a result, the highest portion of the looped bonding wires 16 may be made into contact with the release film 41. This case will be referred to as a mode 2. In accordance with the novel resin-molding method, the circuit board 11 is secured to the circuit board mounting face by the adsorption holes 45 and the adsorption grooves 63 without any floating pheromone.

[Resin-Thermosetting Process]

Figure 5A:
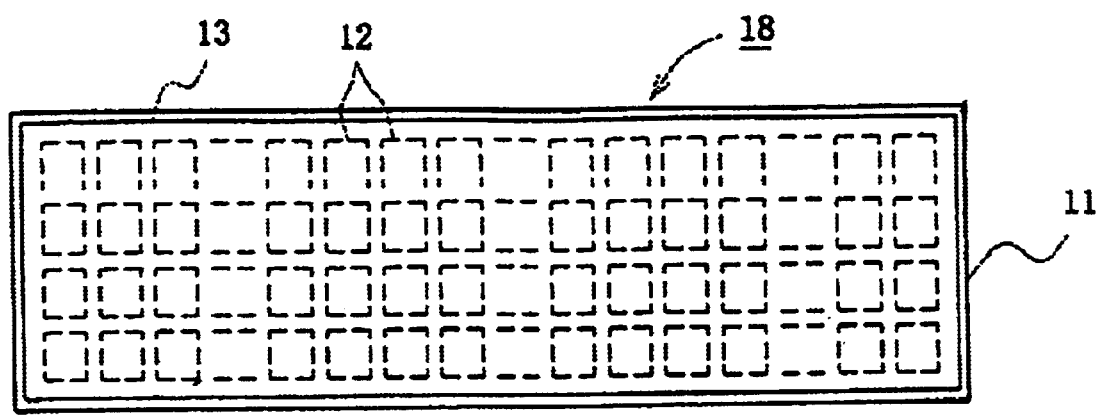
FIG. 5A is a plane view illustrative of the semiconductor package panel obtained by the novel resin-molding method in the first embodiment in accordance with the present invention.
Figure 5B:
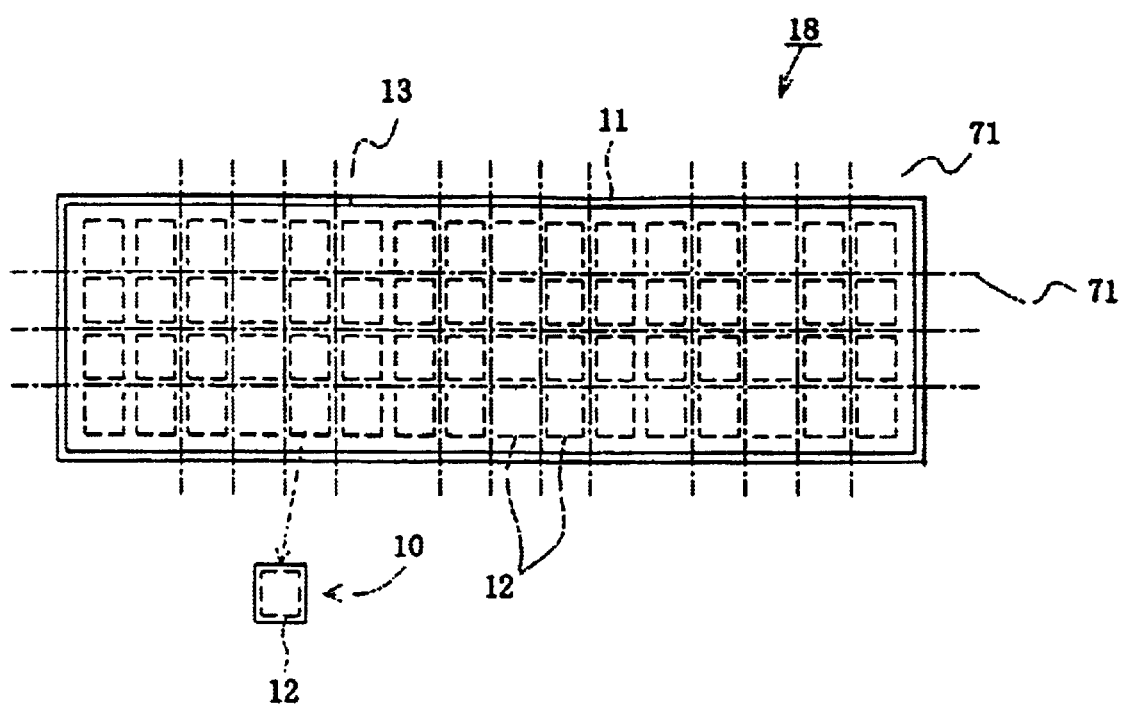
FIG. 5B is a plane view illustrative of the semiconductor package panel with broken blade-cutting lines obtained by the novel resin-molding method in the first embodiment in accordance with the present invention.

After the dies 20 are filled with the resin 26, then the resin 26 is subjected to thermosetting, wherein the resin 26 comprises a thermosetting resin composition, whereby a package panel is completed. The dies 20 are opened for allowing the package panel with the release film 41 to be released from the dies 20 and further the used release film 41 is also removed from the package panel 41. As a result, a package panel 18 is completed. FIG. 5A is a plane view illustrative of the semiconductor package panel obtained by the novel resin-molding method in the first embodiment in accordance with the present invention, FIG. 5B is a plane view illustrative of the semiconductor package panel with broken blade-cutting lines obtained by the novel resin-molding method in the first embodiment in accordance with the present invention.

[External Terminal Formation]

Subsequently, the external terminals are formed. In case of the ball grid array packages, solder balls 55 as the external terminals are provided on the back face of the circuit board 11.

[Package Dicing Process]

Figure 6:
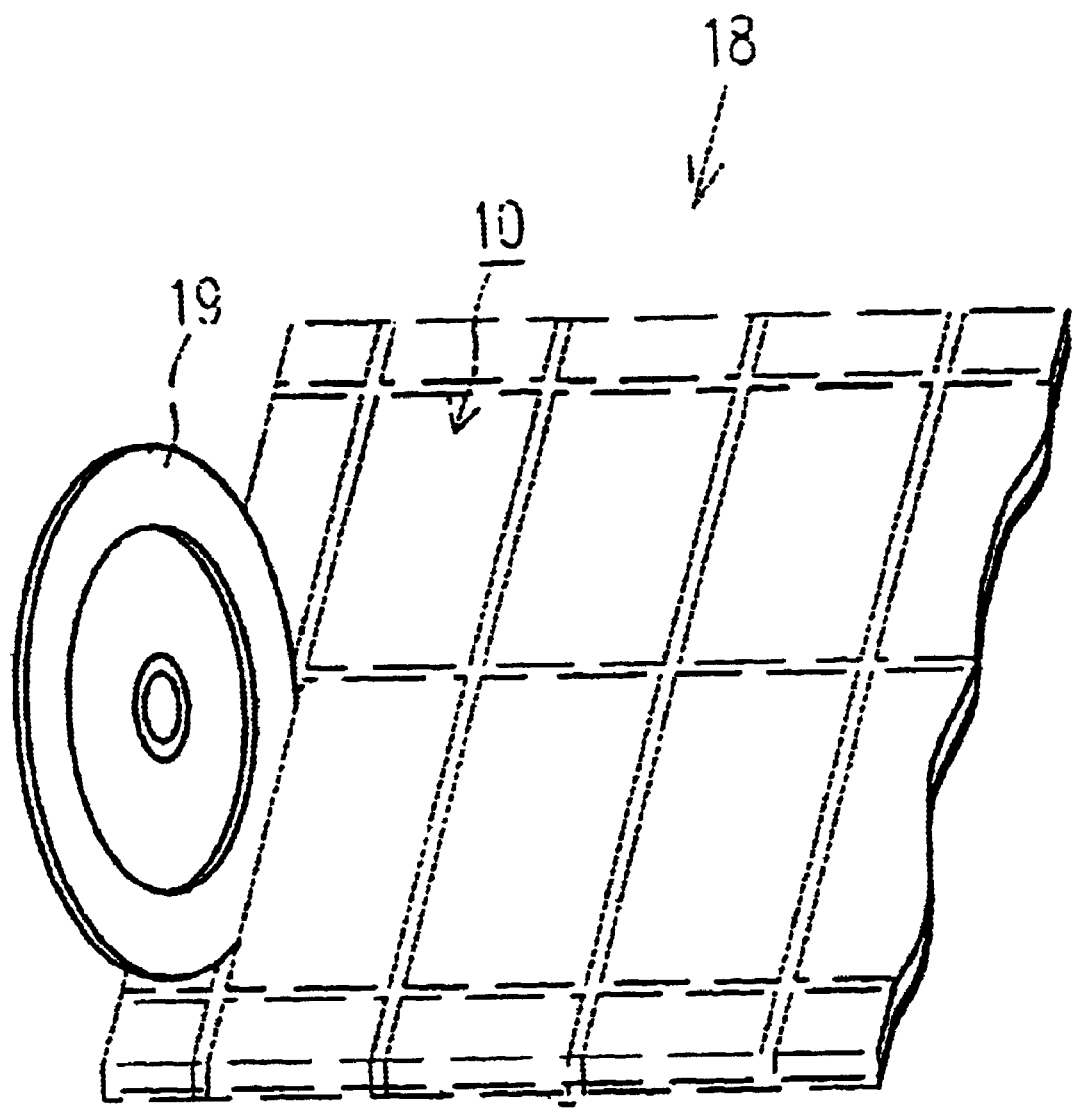
FIG. 6 is a fragmentary schematic perspective view illustrative of a cutting operation, wherein a cutting blade cuts the semiconductor package panel along the cutting lines for dividing the semiconductor package panel into individual semiconductor packages.
Figure 7A:
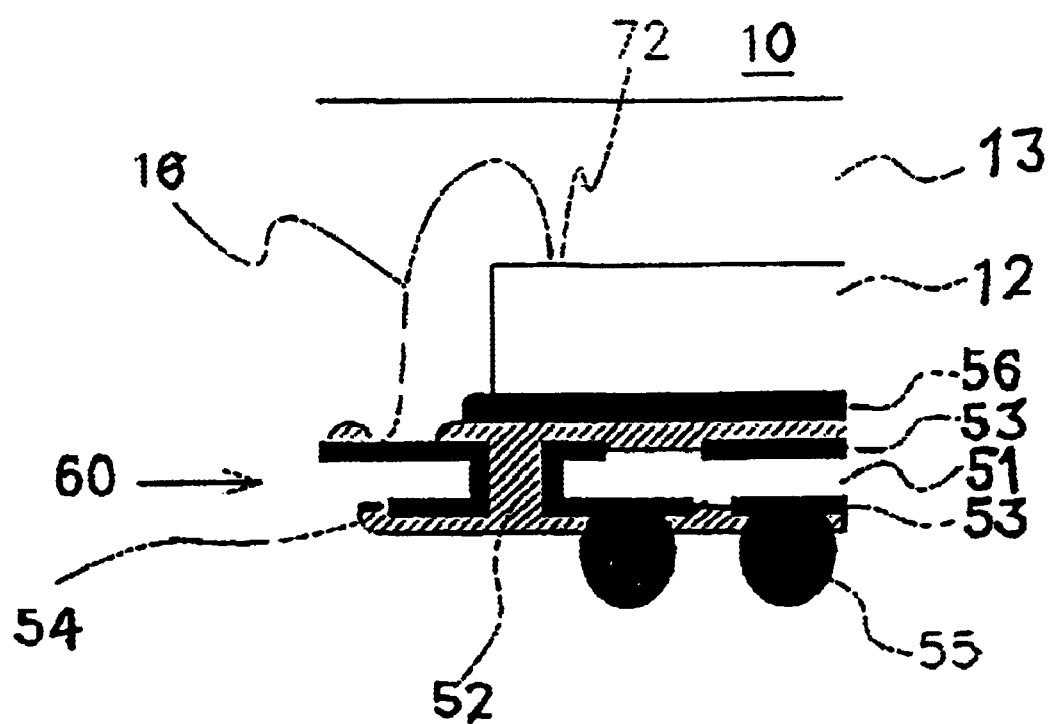
FIG. 7A is a fragmentary cross sectional elevation view illustrative of a semiconductor package divided from the semiconductor package panel in the novel method of the first embodiment in accordance with the present invention.
Figure 7B:
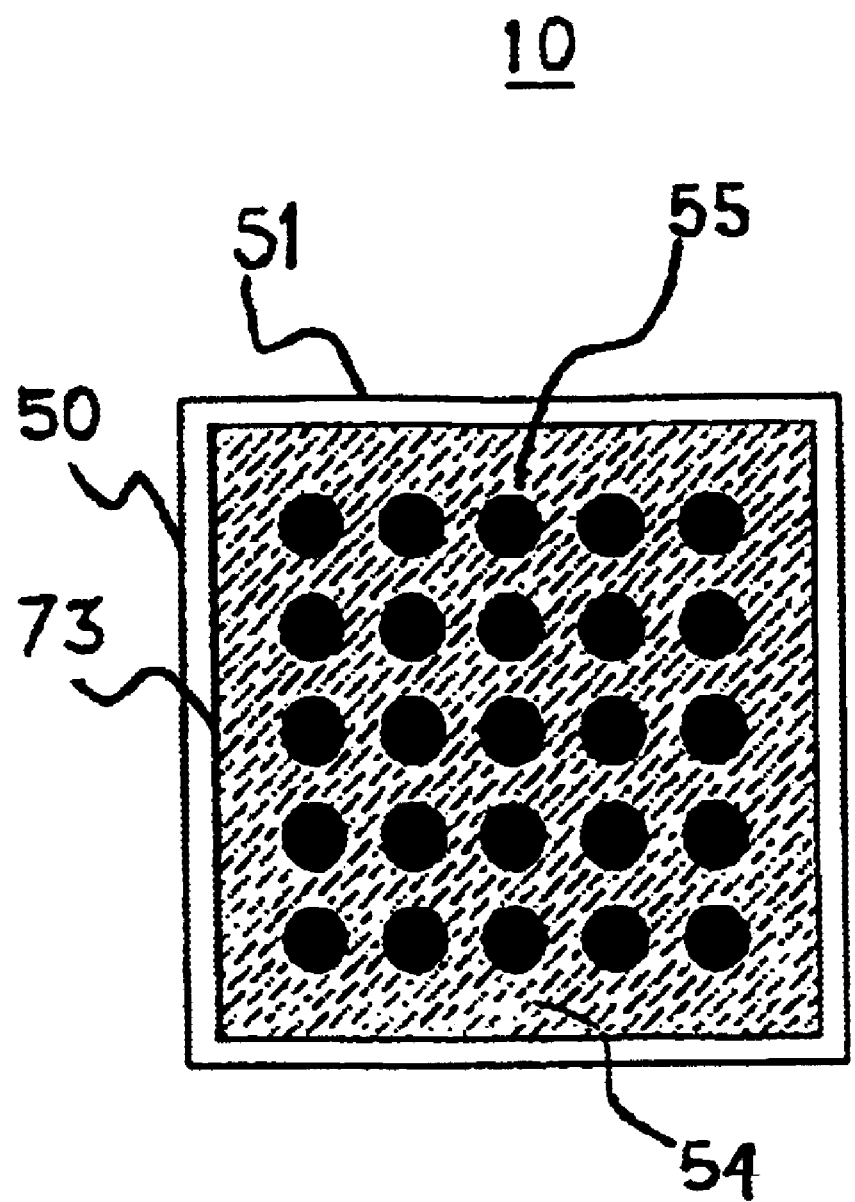
FIG. 7B is a plane view illustrative of ball grid arrays of the semiconductor package of FIG. 7A.

Subsequently, a package dicing process is made by use of a dicing machine with a circular blade which rotates for an abrasive grain cutting to the package panel, whereby the package panel is divided into plural semiconductor packages, wherein the side faces of each of the semiconductor packages are defined by the cutting faces by the circular blade. The semiconductor package panel 18 is cut by a cutting blade along blade-cutting lines 71, so that the semiconductor package panel 18 is divided into plural semiconductor packages 10. FIG. 6 is a fragmentary schematic perspective view illustrative of a cutting operation, wherein a cutting blade cuts the semiconductor package panel along the cutting lines for dividing the semiconductor package panel into individual semiconductor packages. The cutting blade 19 cuts the semiconductor package panel 18 along the cutting lines 71 for dividing the semiconductor package panel 18 into individual semiconductor packages. The cutting blade 19 cuts the semiconductor package panel 18 along the cutting lines 71 extending between the broken lines 50 and 50 shown in FIG. 2B. Since the circuit board units 60 are arranged in 4×16 matrix, whereby 64 of the ball grid array semiconductor packages are obtained. FIG. 7A is a fragmentary cross sectional elevation view illustrative of a semiconductor package divided from the semiconductor package panel in the novel method of the first embodiment in accordance with the present invention. FIG. 7B is a plane view illustrative of ball grid arrays of the semiconductor package of FIG. 7A. The semiconductor package 10 has a circuit board unit 60 which comprises an insulating substrate 51 having through holes 52, copper wirings 53 extending over both the front and back faces of the insulating substrate 51 as well as in the through holes 52, and a solder resist 54 coating over the copper wirings 53 and over the front and back faces of the insulating substrate 51, wherein the solder resist 54 has openings. The semiconductor package 10 also has a die bond agent 56 applied on the surface of the circuit board units 60. The semiconductor package 10 also has a semiconductor device 12 adhered via the die bond agent 56 to the surface of the circuit board units 60. The semiconductor package 10 also has bonding wires 16 which electrically connect electrode pads 72 on the semiconductor device 12 and wire bonding portions 61 of copper wirings 53. The semiconductor package 10 also has a sealing resin 13 for sealing a surface of the circuit board unit 60, wherein the semiconductor device 12 and he bonding wires 16 are sealed with the sealing resin 13. The semiconductor package 10 also has solder balls 55 provided on external terminal contact land portions 62. The solder resist 54 insulate the wirings, the external terminals and the semiconductor chip. As the die bonding agent 56, alloys, solder materials and resins are available. An epoxy resin may be available for the scaling resin 13. As shown in FIG. 7B, the back face of the semiconductor package 10 has a peripheral region 50 which encompasses the circumference 73 of the solder resist 54. Namely, the solder resist 54 does not extend over the peripheral region 50. On the peripheral region 50, the insulating substrate 51 is exposed.

It was investigated by the present inventors that the adsorbing pressure value effected to the circuit board 11 is kept constant at 52 kPa, and the other adsorbing pressure value effected to the release film 41 was varied at 20 kPa, 30 kPa, 40 kPa, 50 kPa, and 70 kPa for carrying out the resin-molding processes. The resin surfaces of the obtained package panels were observed to verify the wire-transfer-defect which means that the circuit board 11 is floated to have the bonding wires 16 contact with the release film 41 to put a contact mark onto the release film and then the contact mark is transferred from the release film to the surface of the resin 13. When the adsorbing pressure value effected to the release film 41 was varied at 20 kPa, 30 kPa, 40 kPa, and 50 kPa, then no wire-transfer-defect appeared. If the adsorbing pressure value effected to the release film 41 reaches 70 kPa, then the wire-transfer-defect appeared. It was accordingly confirmed that in order to avoid the wire-transfer-defect, it is necessary that the adsorbing pressure value effected to the circuit board 11 is kept higher than the adsorbing pressure value effected to the release film 41. If the adsorbing pressure value effected to the circuit board 11 is not higher than the adsorbing pressure value effected to the release film 41, then it is possible that any wire-transfer-defect may appear. This wire-transfer-defect means that the circuit board 11 was floated In order to prevent the floating of the circuit board 11, it is effective that the adsorbing pressure value effected to the circuit board 11 is kept higher than the adsorbing pressure value effected to the release film 41.

EXAMPLE

The circuit board 11 maybe defined in its external size, for example, a width of 65 mm and a length of 190 mm. The semiconductor package 10 may have a square-size of 10 mm-square. Since the circular cutting blade 19 has a blade width of about 350 micrometers, a cutting margin defined between the broken lines 50 and 50 in FIG. 2B may be set at about 0.35 mm. The adsorption groove 63 between the circuit board units 60 may have a width of 0.5 mm and a depth of about 0.03 mm. The adsorption groove 63 in the board peripheral region has a width of 1.2 mm and a depth of about 0.03 mm. The opening 54*a* of the adsorption hole 45 may have a diameter of 1.0 mm and the opening 45*b* thereof may have a diameter of 0.3 mm.

As described above, the circuit board as the circuit base member is secured to the inner mounting face of the dies for preventing the circuit board as the circuit base member from floating, whereby the bonding wires or any parts over the semiconductor package are not made into contact with the release film. As a result, no contact mark is formed on the release film or damage is also provided to the bonding wires or any parts over the semiconductor package. Thus, the semiconductor package can be obtained which is free from the wire-transfer-defect and has a good appearance of the resin package.

Figure 8A:
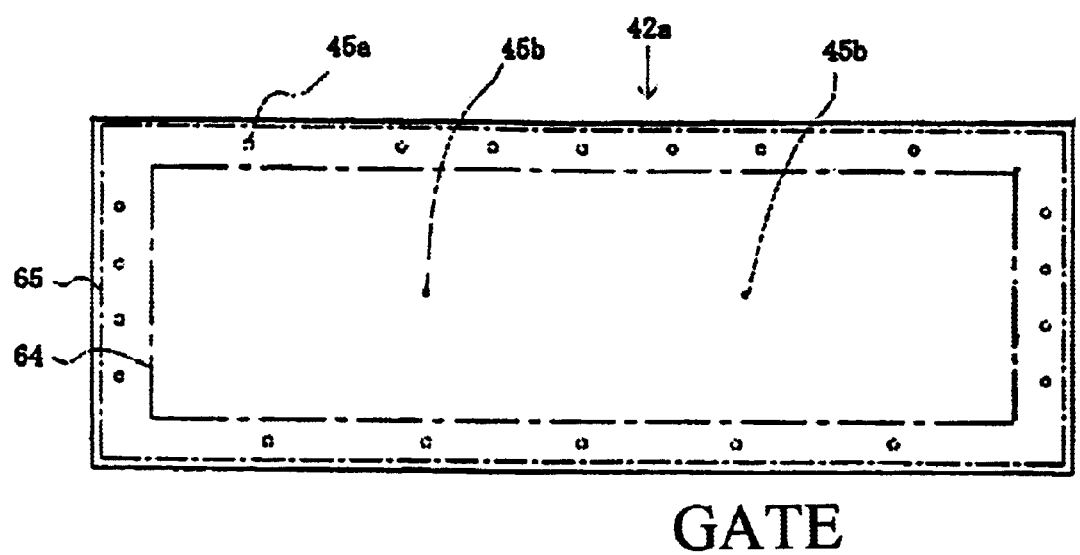
FIG. 8A is a plane view illustrative of a first-modified circuit base member mounting block of the dies in the second embodiment in accordance with the present invention.

A first modification to the above preferred embodiment will be described as a second embodiment, wherein the molding dies are optimized to prevent a large size circuit base member from being floated from the inner wall of the dies and also to realize common use. The second novel dies are structurally different in position of the adsorption holes of the circuit base member mounting block from the first novel dies in the first embodiment. FIG. 8A is a plane view illustrative of a first-modified circuit base member mounting block of the dies in the second embodiment in accordance with the present invention. The first-modified circuit base member mounting block 42*a* of the dies 20 has a peripheral region defined between the broken lines 64 and 65. Openings 45*a* of the adsorption holes 45 are formed in the peripheral region defined between the broken lines 64 and 65. Further, plural openings 45*b* of the adsorption holes 45 are formed in a region surrounded by the broken line 64, wherein the region corresponds to the array region of the circuit board unit 60. In this first-modification, two openings 45*b* are formed on a longitudinal center axis of the rectangle region defined by the broken line 64, wherein the two openings 45*b* are positioned to divide the longitudinal center line into three line segments having the same length. Namely, the two openings 45*b* are positioned on the longitudinal center line at a pitch of one third of the longitudinal center line. The openings 45*b* increase the adsorption force effected to the circuit board even if the circuit board size is relatively large. The position of the openings 45*b* are so decided as avoiding the circuit board units 60. This promotes common use of the dies for different semiconductor packages. Other structures of the dies and the method of resin-molding are the same as described in the above first embodiment.

Figure 8B:
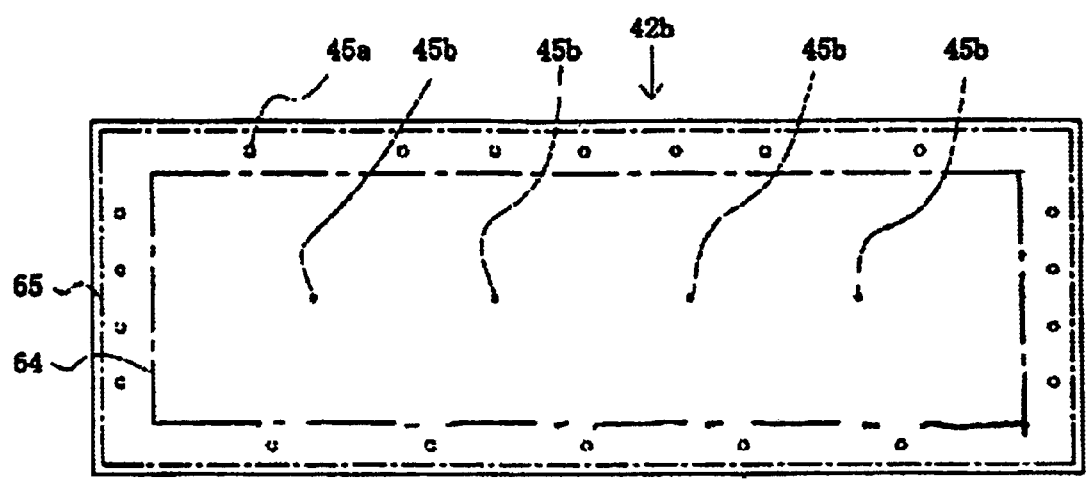
FIG. 8B is a plane view illustrative of a second-modified circuit base member mounting block of the dies in the third embodiment in accordance with the present invention.

A second modification to the above preferred embodiment will be described as a third embodiment, wherein the molding dies are optimized to prevent a large size circuit base member from being floated from the inner wall of the dies and also to realize common use. The third novel dies are structurally different in position of the adsorption holes of the circuit base member mounting block from the first novel dies in the first embodiment. FIG. 8B is a plane view illustrative of a second-modified circuit base member mounting block of the dies in the third embodiment in accordance with the present invention. The second-modified circuit base member mounting block 42*b* of the dies 20 has a peripheral region defined between the broken lines 64 and 65. Openings 45*a* of the adsorption holes 45 are formed in the peripheral region defined between the broken lines 64 and 65. Further, plural openings 45*b* of the adsorption holes 45 are formed in a region surrounded by the broken line 64, wherein the region corresponds to the array region of the circuit board unit 60. In this second-modification, four openings 45*b* are formed on a longitudinal center axis of the rectangle region defined by the broken line 64, wherein the four openings 45*b* are positioned to divide the longitudinal center line into five line segments having the same length. Namely, the four openings 45*b* are positioned on the longitudinal center line at a pitch of one fifth of the longitudinal center line. The openings 45*b* increase the adsorption force effected to the circuit board even if the circuit board size is relatively large. The position of the openings 45b are so decided as avoiding the circuit board units 60. This promotes common use of the dies for different semiconductor packages. Other structures of the dies and the method of resin-molding are the same as described in the above first embodiment.

Figure 8C:
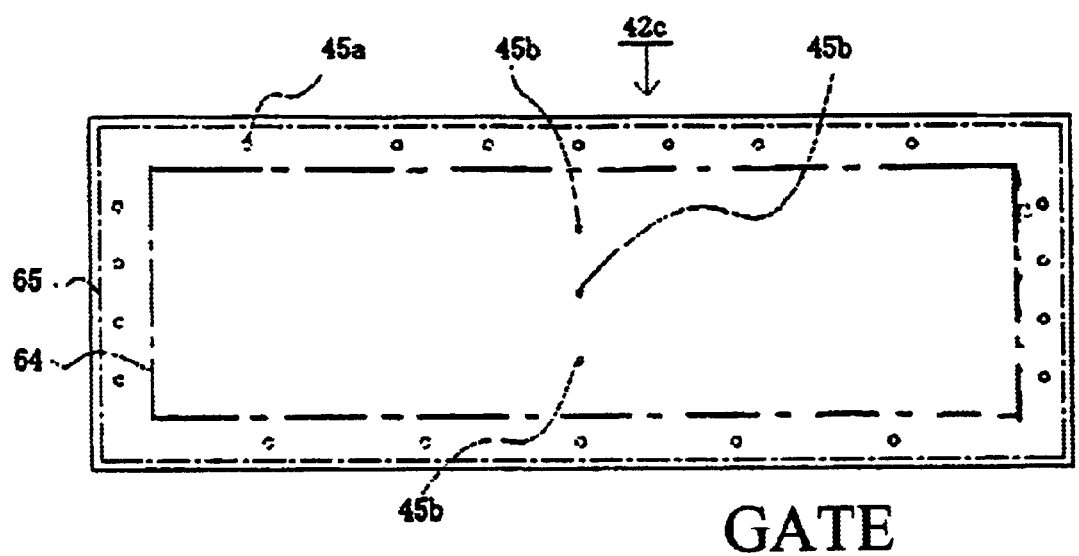
FIG. 8C is a plane view illustrative of a third-modified circuit base member mounting block of the dies in the fourth embodiment in accordance with the present invention.

A third modification to the above preferred embodiment will be described as a fourth embodiment, wherein the molding dies are optimized to prevent a large size circuit base member from being floated from the inner wall of the dies and also to realize common use. The fourth novel dies are structurally different in position of the adsorption holes of the circuit base member mounting block from the first novel dies in the first embodiment. FIG. 8C is a plane view illustrative of a third-modified circuit base member mounting block of the dies in the fourth embodiment in accordance with the present invention. The third-modified circuit base member mounting block 42b of the dies 20 has a peripheral region defined between the broken lines 64 and 65. Openings 45a of the adsorption holes 45 are formed in the peripheral region defined between the broken lines 64 and 65, Furthers plural openings 45b of the adsorption holes 45 are formed in a region surrounded by the broken line 64, wherein the region corresponds to the array region of the circuit board unit 60. In this third-modification, three openings 45b are formed on a horizontal center axis perpendicular to a longitudinal center axis of the rectangle region defined by the broken line 64, wherein the three openings 45b are positioned to divide the horizontal center tine into four line segments having the same length. Namely, the three openings 45b are positioned on the longitudinal center line at a pitch of one quarter of the horizontal center line. The openings 45b increase the adsorption force effected to the circuit board even if the circuit board size is relatively large. The position of the openings 45b are so decided as avoiding the circuit board units 60. This promotes common use of the dies for different semiconductor packages. Other structures of the dies and the method of resin-molding are the same as described in the above first embodiment.

Figure 8D:
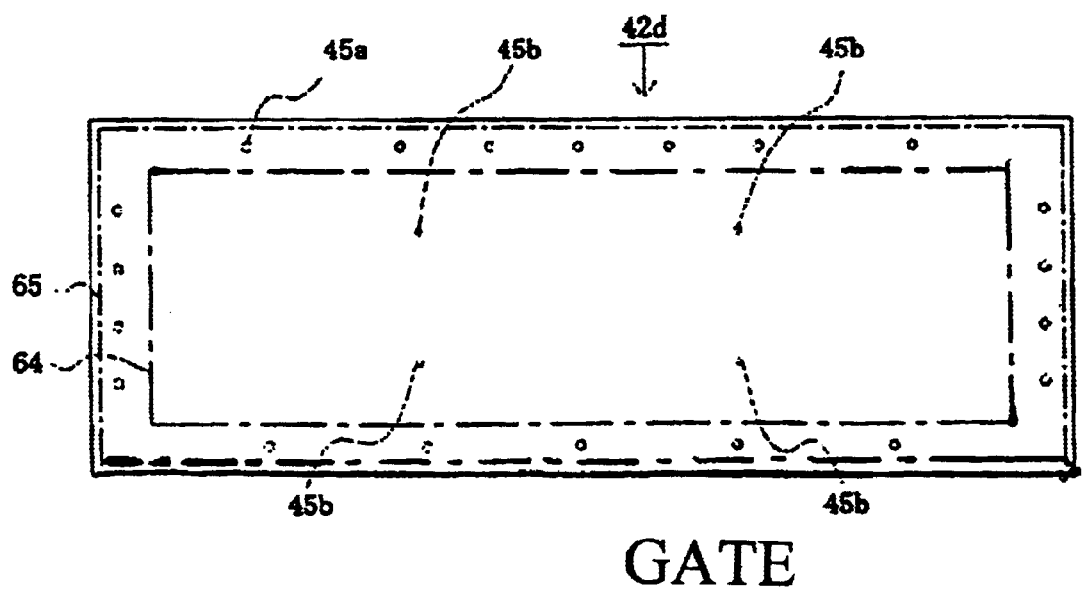
FIG. 8D is a plane view illustrative of a fourth-modified circuit base member mounting block of the dies in the fourth embodiment in accordance with the present invention.

A fourth modification to the above preferred embodiment will be described as a fifth embodiment, wherein the molding dies are optimized to prevent a large size circuit base member from being floated from the inner wall of the dies and also to realize common use. The fourth novel dies are structurally different in position of the adsorption holes of the circuit base member mounting block from the first novel dies in the first embodiment. FIG. 8D is a plane view illustrative of a fourth-modified circuit base member mounting block of the dies in the fourth embodiment in accordance with the present invention, The fourth-modified circuit base member mounting block 42b of the dies 20 has a peripheral region defined between the broken lines 64 and 65. Openings 45a of the adsorption holes 45 are formed in the peripheral region defined between the broken lines 64 and 65. Further, plural openings 45b of the adsorption holes 45 are formed in a region surrounded by the broken line 64, wherein the region corresponds to the array region of the circuit board unit 60. In this fourth-modification, four openings 45b are formed to be uniformly distributed over an entire of the region corresponds to the array region of the circuit board unit 60, wherein the four openings 45b are positioned symmetrically to both the horizontal center line and the longitudinal center line. The openings 45b increase the adsorption force effected to the circuit board even if the circuit board size is relatively large. The position of the openings 45b are so decided as avoiding the circuit board units 60. This promotes common use of the dies for different semiconductor packages. Other structures of the dies and the method of resin-molding are the same as described in the above first embodiment.

A sixth embodiment of the present invention will be described. In this embodiment, the circuit base member 11 is secured to the mounting face of the circuit base member mounting block 42 under a high pressure of the inner gas in the cavity of the dies, wherein the high pressure inner gas in the cavity presses the circuit base member 11 to the mounting face of the circuit base member mounting block 42. No adsorption force nor suction force are effected to the circuit base member 11. Namely, the adsorption holes 45 and the adsorption grooves 63 are unnecessary. The use of the release film 41 is optional. After the cramping operation, a high pressure gas is injected into the cavity through the air vents 46. The high pressure gas in the cavity presses the circuit base member 11 to the mounting face of the circuit base member mounting block 42, whereby the circuit base member 11 is secured to the mounting face of the circuit base member mounting block 42 without floating from the mounting face. The bonding wires or the parts of the semiconductor package are never contact with the release film. As a result, no damage is provided to the parts such as the bonding wires of the semiconductor device, and the good-appearance semiconductor package can be obtained. Further, the molten resin injected into the cavity also receives the high pressure of the inner gas in the cavity, whereby uniform injection of the molten resin is obtained.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A resin-molding method comprising the steps of:
    placing a circuit base member onto a mounting face of first one of paired dies, wherein a back face of said circuit base member is in contact with said mounting face;
    placing said paired dies in a closing state for clamping a peripheral region of said circuit base member with said paired dies;
    injecting a molten resin into a cavity of said paired dies for filling said cavity with said injected resin,
    wherein, in said closing state, a first pressure effected to a front face of said circuit base member is set higher in pressure level than a second pressure effected to said back face of said circuit base member, so as to secure said circuit base member to said mounting face.

2. The resin-molding method as claimed in claim 1, wherein at least a first adsorption hole is formed in said first one of said paired dies for adsorbing said circuit base member onto said mounting face, and at least a second kind of adsorption hole is formed in second one of said paired dies for adsorbing a release film onto said second one of said paired dies.

3. A resin-molding method comprising the steps of:
    placing a circuit base member onto a mounting face of first one of paired dies, wherein a back face of said circuit base member is in contact with said mounting face;
    placing said paired dies in a closing state for clamping a peripheral region of said circuit base member with said paired dies;

injecting a molten resin into a cavity of said paired dies for filling said cavity with said injected resin, wherein, in said closing state, a first pressure effected to a front face of said circuit base member is set higher in pressure level than a second pressure effected to said back face of said circuit base member, so as to secure said circuit base member to said mounting face, wherein at least a first adsorption hole is formed in said first one of said paired dies for adsorbing said circuit base member onto said mounting face, and at least a second kind of adsorption hole is formed in second one of said paired dies for adsorbing a release film onto said second one of said paired dies, and wherein a pressure level of said first kind of adsorption hole for adsorbing said circuit base member onto said mounting face is lower than a pressure level of said second kind of adsorption hole for adsorbing said release film onto said second one of said paired dies.

4. The resin-molding method as claimed in claim 2, wherein a plurality of said first type adsorption hole are formed at least in a peripheral region of said mounting face for absorbing a peripheral region of said circuit base member onto said peripheral region of said mounting face.

5. The resin-molding method as claimed in claim 4, wherein said plural first kind of adsorption holes are further formed in a center region of said mounting face surrounded by said peripheral region of said mounting face for absorbing not only said peripheral region but also a center region of said circuit base member onto said mounting face.

6. The resin-molding method as claimed in claim 5, wherein said mounting face has a rectangle shape, and said plural first kind of adsorption holes are distributed uniformly and symmetrically with reference to both a longitudinal center axis and a horizontal center axis perpendicular to said longitudinal center axis.

7. The resin-molding method as claimed in claim 1, wherein said mounting face is formed on a mounting block which is movable in up and down directions.

8. The resin-molding method as claimed in claim 1, wherein said circuit base member comprises a circuit board.

9. The resin-molding method as claimed in claim 1, wherein said circuit base member comprises a circuit tape.

10. The resin-molding method as claimed in claim 1, wherein said circuit base member is bonded with a plurality of semiconductor devices and said resin-molding method forms a resin-molding package panel including a plurality of resin-molded semiconductor packages.

11. A resin-molding method comprising the steps of:

placing a circuit base member onto a mounting face of first one of paired dies, wherein a back face of said circuit base member is in contact with said mounting face;

placing said paired dies in a closing state for clamping a peripheral region of said circuit base member with said paired dies:

injecting a molten resin into a cavity of said paired dies for filling said cavity with said injected resin, wherein, in said closing state, a first pressure effected to a front face of said circuit base member is set higher in pressure level than a second pressure effected to said back face of said circuit base member, so as to secure said circuit base member to said mounting face, and wherein a high pressure gas is injected into said cavity for securing said circuit base member onto said mounting face.

12. The resin-molding method as claimed in claim 2, wherein said back face of said circuit base member has at least an adsorption groove.

13. The resin-molding method as claimed in claim 12, wherein said adsorption grooves extend over inter-regions between plural circuit base member units in array.

14. The resin-molding method as claimed in claim 13, wherein said adsorption grooves further extend continuously to a peripheral region surrounding said plural circuit base member units in array.

15. The resin-molding method as claimed in claim 14, wherein said first kind of adsorption holes are formed in corresponding positions to said adsorption grooves.

16. A resin-molding method comprising the steps of:

placing a circuit base member onto a mounting face of first one of paired dies, wherein a back face of said circuit base member is in contact with said mounting face;

placing said paired dies in a closing state for clamping a peripheral region of said circuit base member with said paired dies;

injecting a molten resin into a cavity of said paired dies for filling said cavity with said injected resin, wherein, in said closing state, a first pressure effected to a front face of said circuit base member is set higher in pressure level than a second pressure effected to said back face of said circuit base member, so as to secure said circuit base member to said mounting face, and wherein said cavity, into which said molten resin is injected, is positioned in a side of said front face of said circuit base member.

17. A resin-molding method, comprising the steps of:

placing a circuit base member onto a mounting face of first one of paired dies, wherein a back face of said circuit base member is in contact with said mounting face;

placing said paired dies in a closing state for clamping a peripheral region of said circuit base member with said paired dies;

injecting a molten resin into a cavity of said paired dies for filling said cavity with said injected resin, wherein, in said closing state, a first pressure effected to a front face of said circuit base member is set higher in pressure level than a second pressure effected to said back face of said circuit base member, so as to secure said circuit base member to said mounting face, and wherein said cavity, into which said molten resin is injected, is positioned in a side of said front face of said circuit base member, and wherein a high pressure gas is injected into said cavity for securing said circuit base member onto said mounding face.

* * * * *